(12) United States Patent  
Takenaka

(10) Patent No.: US 7,075,369 B2  
(45) Date of Patent: Jul. 11, 2006

(54) VARIABLE GAIN AMPLIFIER AND A LARGE SCALE INTEGRATED CIRCUIT INSTALLED THEREOF APPLICABLE TO PROCESSING SIGNALS

(75) Inventor: Kyoichi Takenaka, Kanagawa-ken (JP)

(73) Assignee: Kabushiki Kaisha Tohiba, Tokyo (JP)

(*) Notice: Subject to any disclaimer, the term of this patent is extended or adjusted under 35 U.S.C. 154(b) by 52 days.

(21) Appl. No.: 10/876,652

(22) Filed: Jun. 28, 2004

(65) Prior Publication Data

US 2005/0017784 A1    Jan. 27, 2005

(30) Foreign Application Priority Data

Jun. 27, 2003    (JP) .............................. 2003-185350

(51) Int. Cl.  
*H03F 3/45* (2006.01)
(52) U.S. Cl. .................. 330/254; 398/202; 455/78; 455/88; 455/245.1; 455/69; 455/118; 369/112.11
(58) Field of Classification Search .............. 369/30.03  
See application file for complete search history.

(56) References Cited

U.S. PATENT DOCUMENTS

| 5,717,360 | A |   | 2/1998  | Vu et al. ..................... 330/253 |
| 5,999,694 | A | * | 12/1999 | Yasuda et al. ................. 386/70 |
| 6,005,506 | A | * | 12/1999 | Bazarjani et al. ........... 341/143 |
| 6,100,760 | A |   | 8/2000  | Maruyama et al. ......... 330/254 |
| 6,525,609 | B1|   | 2/2003  | Behzad ....................... 330/254 |
| 6,573,779 | B1| * | 6/2003  | Sidiropoulos et al. ...... 327/345 |
| 6,710,657 | B1| * | 3/2004  | Yang .......................... 330/254 |
| 6,862,439 | B1| * | 3/2005  | Feng ........................ 455/234.1 |
| 2002/0149813 | A1 | * | 10/2002 | Saruwatari .................. 359/110 |
| 2004/0203528 | A1 | * | 10/2004 | Ammar et al. ............. 455/90.3 |
| 2005/0163006 | A1 | * | 7/2005  | Terashima et al. ....... 369/47.32 |

FOREIGN PATENT DOCUMENTS

| JP | 11-340760   | 12/1999 |
| JP | 2002-111417 | 4/2002  |
| JP | 2003-46352  | 2/2003  |

* cited by examiner

*Primary Examiner*—Robert Pascal  
*Assistant Examiner*—Alan Wong  
(74) *Attorney, Agent, or Firm*—Oblon, Spivak, McClelland, Maier & Neustadt, P.C.

(57) ABSTRACT

Variable gain amplifier and a LSI including the variable gain amplifier that expands an output voltage range or control voltage range without increasing power consumption. The variable gain amplifier includes a voltage-current conversion circuit; a variable gain unit; and a voltage output unit. The voltage-current conversion circuit outputs a first positive current and a first negative current in proportion to an input voltage. The variable gain unit inputting the first positive current and the first negative current controlled by a control signal and outputs four output currents including a second positive current, a third positive current, a second negative current and a third negative current. The voltage output unit inputs either the second positive current and the second negative current or the third positive current and the third negative current Iop3, and outputs a positive output voltage and a negative output voltage.

14 Claims, 17 Drawing Sheets

VARIABLE GAIN AMPLIFIER AND A LARGE SCALE INTEGRATED CIRCUIT INSTALLED THEREOF APPLICABLE TO PROCESSING SIGNALS

CROSS-REFERENCE TO RELATED APPLICATION

This application claims the benefit of priority from Japanese Patent Application No. 2003-185350, filed on Jun. 27, 2003, which is hereby incorporated by reference in its entirety.

FIELD OF THE INVENTION

The present invention relates to a variable gain amplifier and a large scale integrated circuit (LSI) installed thereof applicable to processing signals, such as amplifying optical signals received from an optical disk or amplifying transmitted and/or received signals in a mobile communication terminal. In particular, the present invention relates to a variable gain amplifier and an LSI that substantially expands an output voltage range (i.e., a dynamic range) and also expands a gain control voltage range without increasing the power consumption of an operation circuit of a high frequency waveform.

A variable gain amplifier is widely used to vary its voltage gain based on a control signal. As an example application of a variable gain amplifier at a high-frequency operation area, a variable gain amplifier has been used to amplify various signals, such as signals received from an optical disk or intermediate frequency (IF) signals in a transmitting/receiving unit of a mobile communication device.

Since such a high-frequency operation circuit needs to increase an operational current value in order to perform a quick operation of each circuit element, power consumptions of the high-frequency operational circuit generally tend to increase for performing a quick operation of elements, such as transistors and resistors. Consequently, the larger increase of the power consumption of the circuit becomes a serious problem in accordance with a circuit configuration becoming more complicated and larger in size.

To reduce the increase of the power consumption, it has been proposed to construct the circuit configuration by vertically stacking elements of transistors and resistors. This vertical stacking can increase signal processing functions per a unit current. Accordingly, it becomes possible to increase a signal processing function per unit current. As a result, it becomes possible reduce the number of current paths that increase the power consumption of a variable gain amplifier. Thus, it becomes possible to reduce currents between a source voltage terminal $V_{DD}$ to a grounding terminal GND.

With reference to FIGS. 14 and 15, the above-mentioned problems of a conventional variable gain amplifier will be explained. FIG. 14 is a block diagram for illustrating a conventional variable gain amplifier. Thus, a conventional variable gain amplifier is comprised of a voltage-current conversion circuit 1, a variable gain unit 4, a voltage output unit 5, and a common-mode feedback unit 6. The voltage-current conversion circuit 1 provides two differential current outputs Iop1 and Ion1 in proportion to a voltage difference of two input voltages Vip and Vin. The differential current outputs Iop1 and Ion1 have a respective relation represented by numerical formula (1).

$$Iop1=+g_m(Vip-Vin)+1_b$$

$$Ion1=-g_m(Vip-Vin)+1_b \quad (1)$$

$$Iop1-Ion1=2g_m(Vip-Vin)$$

In formula (1), $g_m$ is a proportion constant, and $I_B$ is a bias current that has a constant value.

The variable gain unit 4 inputs the two differential currents Iop1 and Ion1 and outputs two differential input currents Iop2 and Ion2. The differential current outputs Iop1 and Ion1 in the formula (1) are respectively multiplied by A and (1−A), and are added so that the two differential input currents Iop2 and Ion2 satisfy the following numerical formula (2). Here, it is supposed that a coefficient value A of the variable gain unit 4 is variable in accordance with an external control voltage Vc to the variable gain unit 4, and the coefficient value A meets a condition that A∝Vc.

$$Iop2=A*Iop1+(1-A)*Ion1$$

$$Ion2=A*Ion1+(1-A)*Iop1 \quad (2)$$

At this time, a difference between the differential output currents Iop2 and Ion2 of the variable gain unit 4 is represented by the following numerical formula (3) by using the formulas (1) and (2).

$$Iop2-Ion2=(2A-1)(Iop1-Ion1)=2g(2A-1)(Vip-Vin) \quad (3)$$

Thus, the difference between the differential output currents Iop2 and Ion2 in the variable gain unit 4 is proportional to a difference (Vip−Vin) of the two input voltages Vip and Vin to the voltage conversion circuit 1.

Further, the differential output currents Iop2 and Ion2 from the variable gain unit 4 are supplied to the voltage output unit 5. Consequently, from which two output voltages Vop and Von are generated due to voltage drops of the respective loads Z1 and Z2. It is always supposed that the load Z1 is equal to the load Z2. Thus, Z1=Z2=Z. The respective output voltages Vop and Von from the voltage output unit 5 are represented by the following formula (4).

$$Vop=Z*(Iop2-Ic)+vcom$$

$$Von=Z*(Ion2-Ic)+Vcom \quad (4)$$

Here, two output bias current Ic are provided from the common-mode feedback circuit 6. Accordingly, a difference of the output voltages Vop and Von is represented as follows.

$$Vop-Von=Z*(Iop2-Ion2)=4g_mZ(2A-1)(Vip-Vin) \quad (5)$$

From the above formula (5), it is understood that a difference between the output voltages Vop and Von from the voltage output unit 5 is proportional to a voltage difference between the two input voltages Vip and Vin. Thus, the voltage difference Vi=Vip−Vin. Accordingly, when the coefficient value A of variable gain unit 4 is varied by the control signal Vc to the variable gain unit 4, it becomes possible to realize a variable gain amplifier where its voltage gain is controlled by the control signal Vc.

The common-mode feedback unit 6 compares a mean value Vcom of the two output voltages Vop and Von with an external reference voltage Vref. By amplifying a voltage difference between them and by adding the amplified voltage difference to the respective output bias current Ic, a feed-back loop is constructed through the voltage output unit 5. By doing this, the mean value Vcom of the two output voltages Vop and Von is always controlled to be equal to the external reference voltage Vref.

FIG. 15 illustrates a detail circuit configuration of the variable gain amplifier illustrated in FIG. 14. When two differential input voltages Vip and Vin are supplied to a voltage-current conversion unit 3 in voltage-current conversion circuit 1, two differential output currents Iop1 and Ion1 are outputted from voltage-current conversion circuit 1. Variable gain unit 4, voltage output unit 5 and common-mode feedback unit 6 are constructed by the same current path between a power source voltage VDD and a grounding potential GND. By vertically stacking elements of transistors and resistor so as to construct a plurality of function blocks in the same current path between a power source voltage VDD and a grounding potential GND, it becomes possible to reduce a current consumption.

Two output currents Iop1 and Ion1 from voltage-current conversion unit 1 satisfy the above described formula (1). Thus, they are represented as follows.

$$Iop1 = I_g + g_{m1} Vi$$

$$Ion1 = I_B - g_{m1} Vi \quad (6)$$

In formula (6), the two output currents Iop1 and Ion1 are inputted to each of transistors M1 to M4 in the variable gain unit 4. Here, each size of the respective transistors M1 to M4 is supposed to be equal, i.e., M1=M2=M3=M4=M, and a trans-conductor parameter $K_2$ is supposed to be represented by formula (7).

$$K_2 = \frac{1}{2} \mu C_{ox} \frac{W}{L} \quad (7)$$

Here, μ is the hall mobility ratio, Cox is a capacity of an unit area of gate, W is a channel width, and L is a channel length.

When the control voltage Vc is equal to a difference between two control voltages Vc1 and Vc2 in variable gain unit 4, i.e., Vc=Vc1−Vc2, each drain current of the respective transistors M1 to M4 in variable gain unit 4 are approximately represented by formula (8), respectively.

$$I_1 = \frac{Iop1}{2} - Vc\sqrt{2K_2 Iop1} \quad (8)$$

$$I_2 = \frac{Iop1}{2} + Vc\sqrt{2K_2 Iop1}$$

$$I_3 = \frac{Iop1}{2} + Vc\sqrt{2K_2 Ion1}$$

$$I_4 = \frac{Iop1}{2} - Vc\sqrt{2K_2 Ion1}$$

Accordingly the two output currents Iop2 and Ion2 of the variable gain unit 4 are represented by formulas (9) and (10), respectively.

$$Iop2 = I_2 + I_4 = \frac{Iop1 + Ion1}{2} + Vc\sqrt{2K_2} \left(\sqrt{Iop1} - \sqrt{Ion1}\right) \quad (9)$$

$$Ion2 = I_2 + I_4 = \frac{Iop1 + Ion1}{2} + Vc\sqrt{2K_2} \left(\sqrt{Ion1} - \sqrt{Iop1}\right)$$

$$Iop2 - Ion2 = 2Vc\sqrt{2K_2}(\sqrt{Iop1} - \sqrt{Ion1}) \quad (10)$$

By assuming that $I_B$ is larger than, the difference of the two differential output currents Iop1 and Ion1 are calculated and are approximately represented by formula (11).

$$Iop2 - Ion2 = 2Vc\sqrt{\frac{2K_2}{I_B}} g_{m1} Vi \quad (11)$$

Since the difference of the two differential output currents Iop1 and Ion1 is represented as formula (11), it is understood that the output currents of the variable gain unit 4 vary its current gain with a value of the control voltage Vc.

When the differential currents Iop2 and Ion2 of formula (11) are supplied to the voltage output unit 5, two output voltages Vop and Von are represented by formula (12).

$$Vo = Vop - Von = (Vop - Vcom) - (Von - Vcom) \quad (12)$$

$$= Z(Iop2 - Ic) - Z(Ion2 - Ic)$$

$$= Z(Iop2 - Ion2)$$

$$= 2Zvc\sqrt{\frac{2K_2}{I_B}} g_{m1} Vin$$

$$= \beta \cdot Vc \cdot Vin$$

$$\left(\beta = 2g_{m1} Z \sqrt{\frac{2K_2}{I_B}} = const.\right)$$

Accordingly, the output voltage (Vo=Vop−Von) is proportional to the input voltage Vi of the variable gain amplifier, and its voltage gain varies with the control voltage $V_c$. Transistors M5 and M6 in the common-mode feedback unit 6 construct a cascade circuit for increasing an output resistance.

The variable gain amplifier shown in FIG. 14 or 15 have problems and disadvantages as explained below. We should consider the conditions of how the variable gain amplifier shown performs normal operations. At first, each of transistors M1 to M4 in the variable gain unit 4 should be operated in their respective saturation areas. If each of transistors M1 to M4 does not operate in a saturation area, a low resistance component at each of source terminals of the respective transistors M1 to M4 is impossible to see from output terminals Vop and Von. Accordingly, the characteristic of the output voltage Vo cannot be satisfied by above-mentioned formula (12).

Assuming that a control voltage Vc1 is constant (Vc1=constant), and the control voltage Vc2 is larger than the control voltage Vc1 (Vc2>Vc1), the following conditions (13) should be satisfied in order that each of transistors M1 to M4 normally operate in a saturation area.

$$Vop \leq Vcl - V_{Tp}$$

$$Von \leq Vcl - V_{Tp} \quad (13)$$

The above conditions (13) indicate that each upper limit voltage of the respective output voltages Vop and Von from the voltage output unit 5 is restricted by the value of the control voltage Vc1 in the variable gain unit 4.

Each of the lower limit voltages of the output voltages Vop and Von are also restricted. In order to have a sufficiently high output resistance, each of transistors M5 to M

8 of the common-mode feedback unit 6 should be operated in a saturation area, and the following conditions (14) must be satisfied.

$$Vop \geq V_{DS5(sat.)} + V_{DS7(sat.)} = const.$$

$$Von \geq V_{DS6(sat.)} + V_{DS8(sat.)} = const. \quad (14)$$

$V_{DS(sat.)}$ may have a voltage value of approximately from 0.2V to 0.4V.

Further, in order to operate transistors M9 and M10 in their respective saturation areas, the source voltages Vs1 and Vs2 of transistors M1 to M4 in the variable gain unit 4 must satisfy the following conditions (15).

$$V_{S1} \leq VDD - V_{DS9(sat)} = const.$$

$$V_{S2} \leq VDD - V_{DS10(sat)} = const. \quad (15)$$

Suppose that the control voltage Vc2 in the variable gain unit 4 reaches to a high voltage so that the respective transistors M1 and M4 become cut-off at the maximum gain. The maximum value of the control voltage Vc2 max must satisfy formula (16).

$$Vs1 = V_{C2\ max} + V_{rp} \leq VDD - V_{DS9(sat.)}$$

$$Vs2 - V_{C2\ max} + V_{Tp} \leq VDD - V_{DS10(sat.)} \quad (16)$$

By assuming that each $V_{DS9(sat.)}$ of the respective transistors has the same voltage, the above-mentioned formulas (13) to (16) are summarized as shown in formula (17).

$$\max\{V_{O\_P-P}\} + \max\{V_{C\_P-P}\} = (Vo\ max - Vo\ min) + (V_{C2}\ max - V_{C1}) = VDD - 3V_{DS(sat.)} = const. \quad (17)$$

Formula (17) represents that a sum of the maximum amplitude value of the output voltage Vo from the variable gain amplifier and a variable voltage range of the control voltage has a respective constant value. Thus, the maximum amplitude value (18) and the variable voltage range of the control voltage (19) are respectively explained as follows.

$$\max\{V_{O\_P-P}\} \quad (18)$$

$$\max\{V_{C\_P-P}\} \quad (19)$$

Accordingly, it is understood that the conventional circuit configuration is extremely restricted by the formula (17). In spite of this it is preferable to keep wider ranges for both the output voltage and the control voltage in order to achieve quick operations for a high frequency circuit. The range of the maximum output voltage and the range of the control voltage becomes a trade-off relationship. Accordingly, since it is impossible to increase both the output voltage and the control voltage at the same time, the maximum amplitude of output voltage Vo should become a small value when the variable range of the control voltage Vc(=|Vc2-Vc1|) is expanded.

If the maximum amplitude of output voltage Vo becomes a small value, it is a disadvantage for a signal noise ratio (S/N), since an apparent noise level against a signal level becomes a large value. Further, if it is attempted to keep a variable gain range required by a specification under such a condition that the variable range of control voltage Vc is small, the amplifier circuit operates under an extremely unstable status, since a large gain variation occurs due to disturbances, such as a noise.

Generally, it is required for a variable gain amplifier applicable to a signal processing circuit for receiving signals from an optical disk, such as a digital versatile disk (DVD) or a compact disk (CD) and applicable transmitting and receiving IF signals for a mobile communication terminal to keep a wider range of variable gain. If the range of the variable gain becomes small, it is necessary to construct a multiple stages of stacked amplifiers. This is an extreme disadvantage when constructing a variable gain amplifier into a compact and small size. Further, it generates another problem of high power consumption. If the variable gain range becomes wider, gain sensitivity against the control signal also becomes higher. Normally, the control signal is an external input signal to a variable gain amplifier. Accordingly, the control signal is easily affected due to disturbances, such as noise. Thus, even when attempting to keep a wider gain range within a narrower control voltage gain, the conventional variable gain amplifier becomes an unstable circuit with a large variation of gain due to noises.

Since transistors comprising a circuit need to keep a certain drain-source voltage for a necessary operation, a stacking configuration of transistor elements restricts the circuit operations within a limited range of a power voltage. Even when it keeps operation, an operational voltage range of an internal circuit with including amplitude of maximum output voltage, i.e., a dynamic range, becomes small. When the signal voltage amplitude becomes small, a circuit becomes very succeptible to disturbances, such as noise. This is also a serious problem. In particular, since a required variable gain range for a variable gain amplifier is generally wide, gain sensitivity will become high when a control voltage range becomes small. Consequently, output voltage amplitudes of the variable gain amplifier will become unstable against disturbances that enter into a control terminal.

SUMMARY OF THE INVENTION

A variable gain amplifier according to an embodiment of the present invention, comprising: a voltage-current conversion circuit configured to output a first positive current and a first negative current in proportion to an input voltage, respectively; a variable gain unit configured to supply four output currents that are obtained by processing the input first positive and negative currents under a control of a gain factor A (0<A<1) controlled by a control signal, wherein the four output currents include a second positive current obtained by multiplying the first positive current by the factor A, a third positive current obtained by multiplying the first positive current by the factor (1−A), a second negative current obtained by multiplying the first negative current by the factor A and a third negative current obtained by multiplying the first negative current by the factor (1−A); and a voltage output unit configured to output a positive output voltage and a negative output voltage by inputting either one groups of the second positive current and the second negative current or the third positive current or the third negative current.

A light receiving signal processing LSI according to an embodiment of the present invention, comprising: an analog signal processing unit installed with the variable gain amplifier, such as defined in claim 1, in which the input voltage may include at least one optical signal voltage generated from an optical receiver; a digital signal processing unit configured to process digital signals converted from analog signals supplied from the analog signal processing unit; a decoder configured to decode the converted digital signals; and a processing unit configured to perform signal processing calculations in the analog signal processing unit, the digital signal processing unit, and the decoder, respectively.

A transmitting/receiving signals processing LSI applicable to a mobile communication terminal, comprising: an analog signal processing unit installed with the variable gain amplifier, such as defined in claim 1, in which the input voltage may include at least one signal received at a mobile communication terminal as the input voltage; a digital signal processing unit configured to process digital signals converted from analog signals supplied from the analog signal processing unit; a decoder configured to decode the converted digital signals; and a processing unit configured to perform signal processing calculations in the analog signal processing unit, the digital signal processing unit, and the decoder, respectively.

A mobile communication terminal according to an embodiment of the present invention comprising: a radio controller configured to convert and amplify received radio frequency digital signals into intermediate frequencies, and to convert and amplify transmitting signals into high frequency signals; a control unit configured to control operations of the mobile communication terminal; an audio control unit configured to perform a bandwidth extension process and a bandwidth compression process in accordance with a data rate received from the control unit; and an audio input/output unit configured to amplify output analog signals and input analog signals supplied to a speaker from a microphone in the audio input/output unit; wherein the radio controller includes a variable gain amplifier, comprising: a voltage-current conversion circuit configured to output a first positive current and a first negative current in proportion to a positive and a negative input voltage, respectively; a variable gain unit configured to supply four output currents obtained by processing first positive current and first negative current controlled by a gain factor A (0<A<1) controlled by a control signal, wherein the four output currents include a second positive current obtained by multiplying the first positive current by the factor A, a third positive current obtained by multiplying the first positive current by the factor (1−A), a second negative current obtained by multiplying the first negative current by the factor A, and a third negative current obtained by multiplying the first negative current by the factor (1−A); and a voltage output unit configured to output a positive output voltage and a negative output voltage by inputting either the second positive current and the second negative current or the third positive current and the third negative current.

An optical disk apparatus, comprising: an optical disk drive section including an optical receiver configured to project a laser beam on an optical disk and convert the laser beam reflected from the optical disk into an electric signal, and an optical head amplifier configured to amplify reproduced data through the optical receiver; a system processor section configured to control operations of the optical disk apparatus; a data RAM section configured to store the reproduced data, a video decoder section configured to decode the video data stored in the data RAM section; an audio decoder section configured to decode the audio data stored in the data RAM section; a D/A and data reproducing section configured to convert the decoded video and audio data into an analog video and an audio signal, respectively; and a monitor and a speaker configured to display the reproduced video data and to reproduce the reproduced audio data, respectively; wherein the optical head amplifier includes a variable gain amplifier, comprising: a voltage-current conversion circuit configured to output a first positive current and a first negative current in proportion to a positive input voltage and a negative input voltage, respectively; a variable gain unit configured to supply four output currents obtained by processing the first positive current and first negative current controlled by a gain factor A (0<A<1) controlled by a control signal, wherein the four output currents include a second positive current obtained by multiplying the first positive current by the factor A, a third positive current obtained by multiplying the first positive current by the factor (1−A), a second negative current obtained by multiplying the first negative current by the factor A, and a third negative current obtained by multiplying the first negative current by the factor (1−A); and a voltage output unit configured to output a positive output voltage and a negative output voltage by inputting either the second positive current and the second negative current or the third positive current and the third negative current.

BRIEF DESCRIPTION OF THE DRAWINGS

The accompanying drawings, which are incorporated in and constitute part of this specification, illustrate various embodiments and/or features of the invention and together with the description, serve to explain the invention. Wherever possible, the same reference number will be used throughout the drawings for same or like parts.

DETAILED DESCRIPTION

Figure 1:
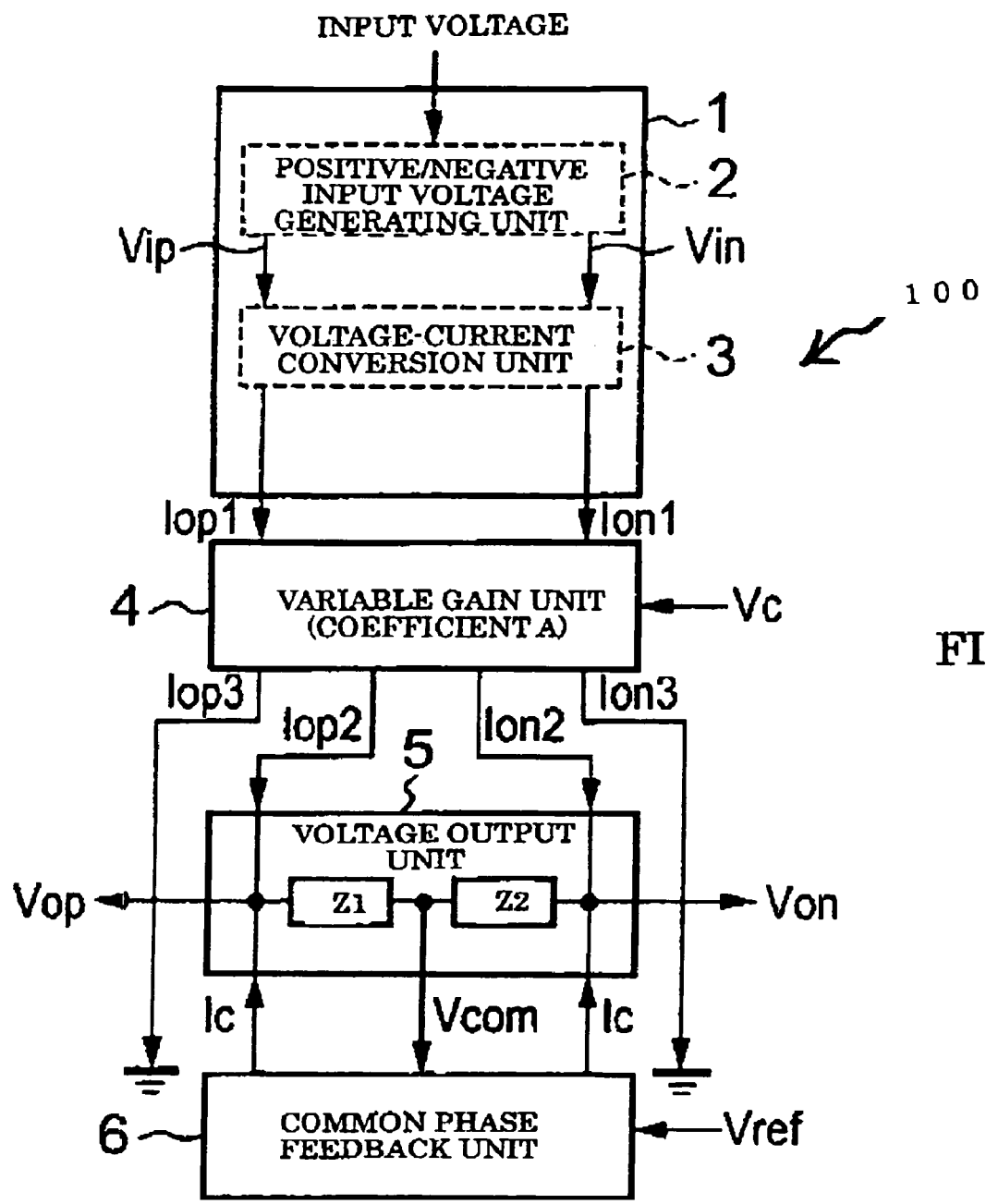
FIG. 1 is a functional block diagram of an exemplary circuit diagram for a variable gain amplifier in which the methods and apparatus of an embodiment of the present invention may be implemented.

Reference will now be made in detail to exemplary embodiments of the invention, examples of which are illustrated in the accompanying drawings. Wherever possible, the same reference numbers are used throughout the drawings to refer to same or like parts. As illustrated in FIG. 1, an exemplary embodiment of a variable gain amplifier 100 consistent with the present invention includes a voltage-current conversion circuit 1, a variable gain unit 4, a voltage output unit 5 and a common mode feed back unit 6. The voltage-current conversion circuit 1 includes a positive-negative voltage generating unit 2 that generates a positive input voltage Vip and a negative input voltage Vin from an input voltage and a voltage-current conversion unit 3 that inputs the positive input voltage Vip and the negative input voltage Vin and outputs a first positive current Iop1 and a first negative current Ion1 in proportion to the potential difference between the positive and negative input voltages Vip and Vin.

The first positive current Iop1 and the first negative current Ion1 are supplied to the variable gain unit 4. In the variable gain unit 4, the supplied currents are controlled by a gain factor A (0<A<1) that is controlled by a control signal Vc. Thus, the variable gain unit 4 generates a second positive current Iop2 that is obtained by multiplying A times of the first positive current Iop1, a third positive current Iop3 that is obtained by multiplying (1−A) times of the first positive current Iop1, a second negative current Ion2 that is obtained by multiplying A times of the first negative current Ion1, and a third negative current Ion3 that is obtained by multiplying (1−A) times of the first negative current Ion1. Thus, the variable gain unit 4 generates four output currents Iop2, Ion2, Iop3 and Ion3.

Among the four output currents Iop2, Ion2, Iop3 and Ion3, either one of a pair of the second positive current Iop2 and the second negative current Ion2 or a pair of the third positive current Iop3 and the third negative current Ion3 is supplied to the voltage output unit 5 in order to output a positive output voltage Vop and a negative output voltage Von from the voltage output unit 5. In FIG. 1, a pair of the second positive current Iop2 and the second negative current Ion2, and a pair of the third positive current Iop3 and the third negative current Ion3 are connected to a ground terminal.

Figure 2:
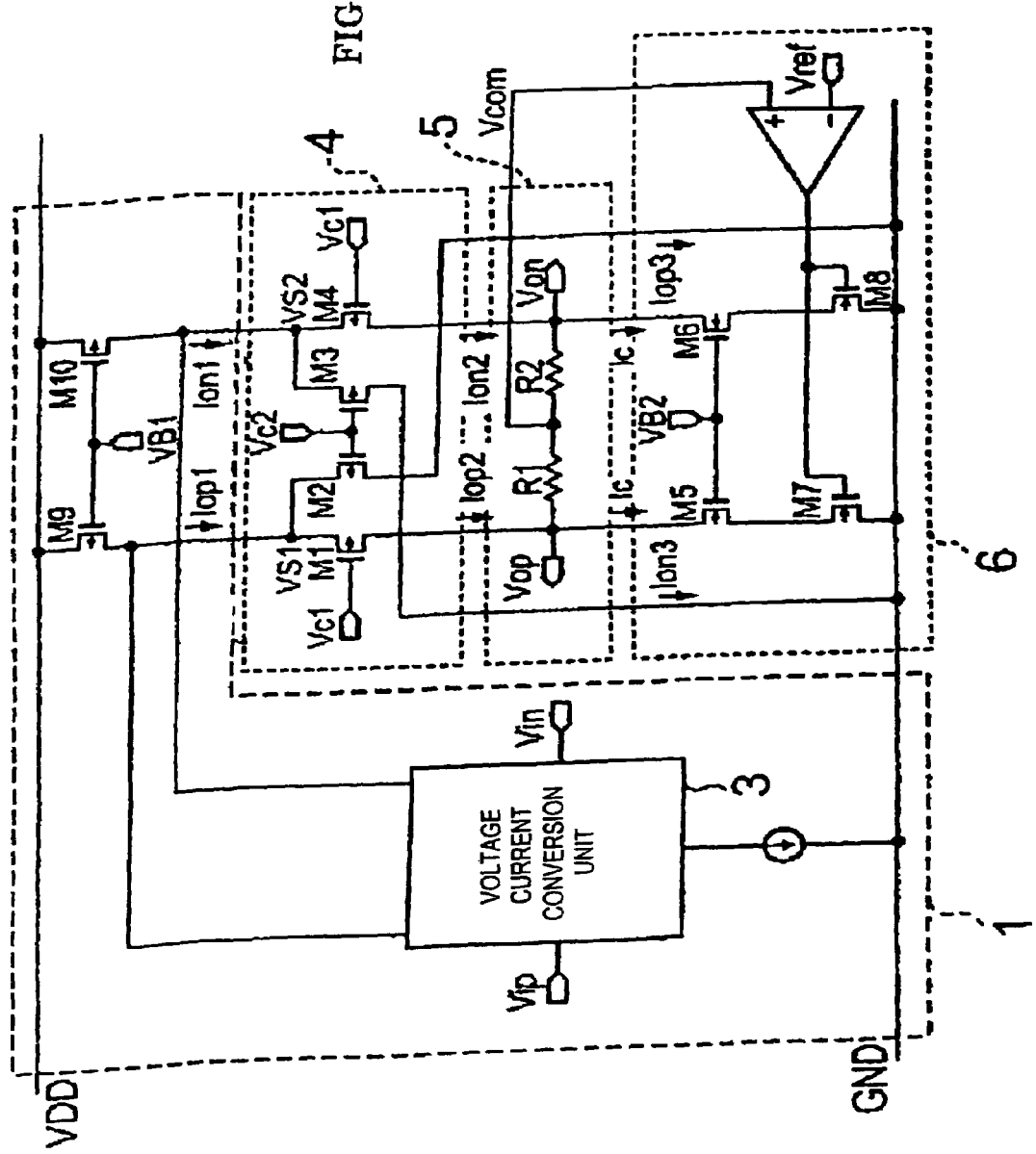
FIG. 2 is an exemplary circuit configuration for variable gain amplifier illustrated in FIG. 1.

FIG. 2 illustrates a circuit configuration of the embodiment of the variable gain amplifier 100 shown in FIG. 1. An output current of the variable gain unit 4 in FIG. 2 is represented by formulas (20).

$$Iop2 = I_1, Ion2 = I_4, Iop3 = I_2, Ion3 = I_3 \qquad (20)$$

Assuming that the value of Vc1 is fixed, and that Vc=Vc1−Vc2, The following equations are obtained.

$$I_1 = \frac{Iop1}{2} - Vc\sqrt{2K_2 Iop1} \qquad (21)$$

$$I_2 = \frac{Iop1}{2} + Vc\sqrt{2K_2 Iop1}$$

$$I_3 = \frac{Ion1}{2} + Vc\sqrt{2K_2 Ion1}$$

$$I_4 = \frac{Ion1}{2} - Vc\sqrt{2K_2 Ion1}$$

When I1 and I4 are supplied to the voltage output unit 5, the output voltage Vo is represented by formula (22).

$$\begin{aligned}
Vo &= Vop - Von \qquad (22) \\
&= (Vop - Vcom) - (Von - Vcom) \\
&= Z(I1 - I4) \\
&= Z\left(\frac{Iop1 - Ion1}{2} - VC\sqrt{2K_2}\left(\sqrt{Iop1} - \sqrt{Ion1}\right)\right) \\
&= g_m Z\left(1 - Vc\sqrt{\frac{2K_2}{I_B}} Vi\right)
\end{aligned}$$

Accordingly, a gain of output voltage at the control voltage Vc is variable.

One of the advantages of the embodiment of the present invention is that a variable range value of control voltage Vc2 can maintain width when control voltage Vc1 remains a constant. Under the circuit configuration illustrated in FIG. 2, drain terminals of the transistors M2 and M3 are connected to a ground terminal. Accordingly, it never affects an output resistance of the voltage output unit 5. Consequently, a voltage value of control voltage Vc2 is not restricted by an operation voltage range of voltage output unit 5. Since the control voltage Vc2 can reduce in so far as that transistors M1 and M4 do not enter a cut-off state, it becomes possible for a variable voltage range of the control voltage Vc2 to be largely separate from the control voltage Vc1 against earth terminal.

Generally, the variable gain amplifier operates at bi-quadrant. If control voltage Vc2 is larger than control voltage Vc1 (Vc2>Vc1), the gain of the variable gain amplifier becomes negative. Accordingly, a voltage value of Vc2 is used within a range from the ground terminal to the control voltage Vc1. However, when the respective size of transistors M2 and M3 are made smaller than each of transistor size of transistors M1 and M4, the gain of the variable gain amplifier does not become negative, even under the condition Vc2>Vc1. Accordingly, it becomes possible to further expand a variable voltage range of the control voltage Vc2.

Figure 3:
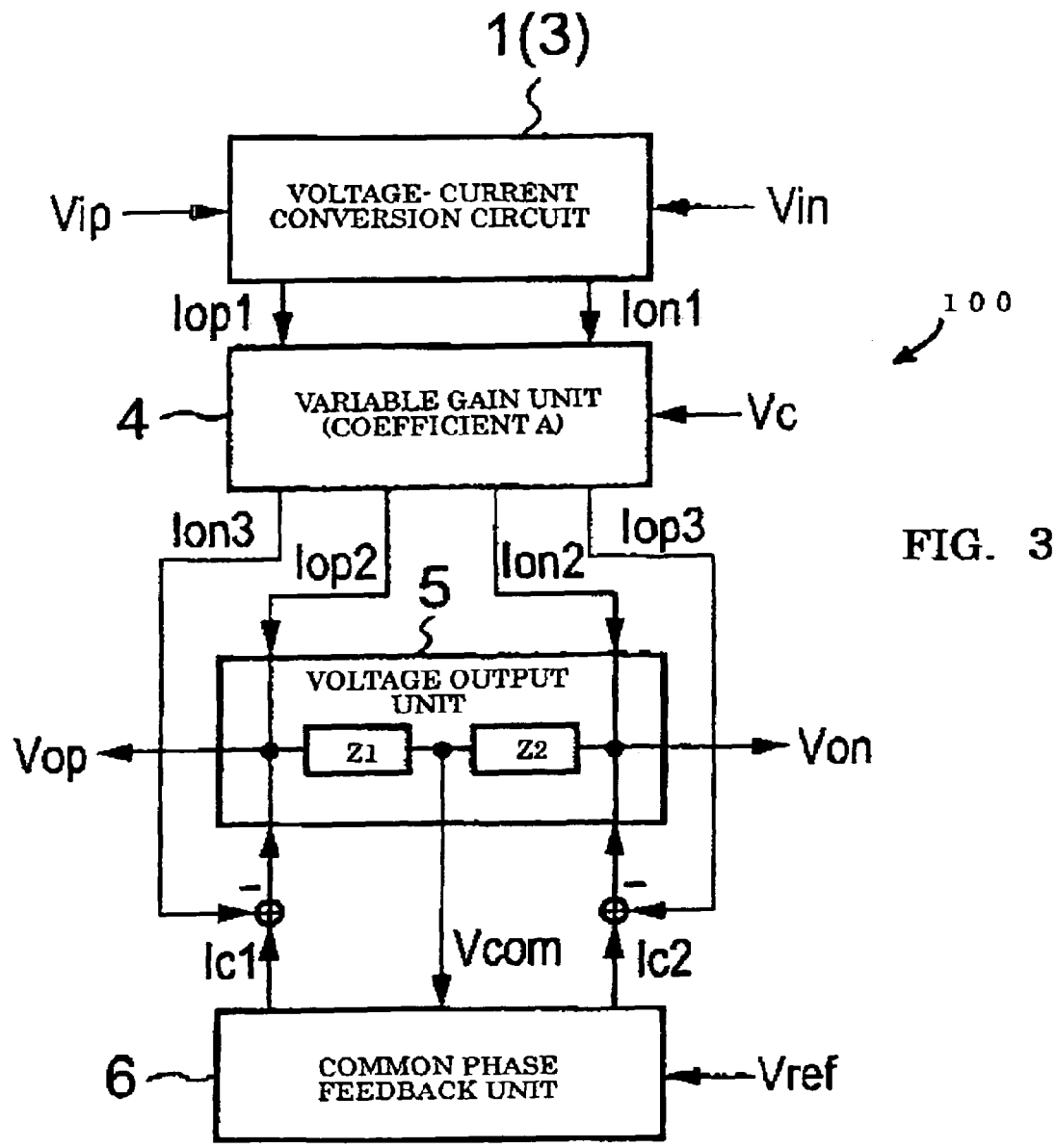
FIG. 3 is a functional block diagram of another exemplary circuit diagram for a variable gain amplifier in which the methods and apparatus of an embodiment of the present invention may be implemented.

FIG. 3 is a conceptual block diagram illustrating another embodiment of the variable gain amplifier consistent with the present invention. In the above mentioned embodiment in FIG. 1, currents Iop3 and Ion3 from the variable gain unit 4 are connected to a ground terminal. On the contrary, currents Ion3 and Iop3 in this embodiment illustrated in FIG. 3 are respectively added to output currents Ic1 and Ic2 from the common-mode feedback unit 6 (Ic1=Ic2=Ic).

Figure 4:
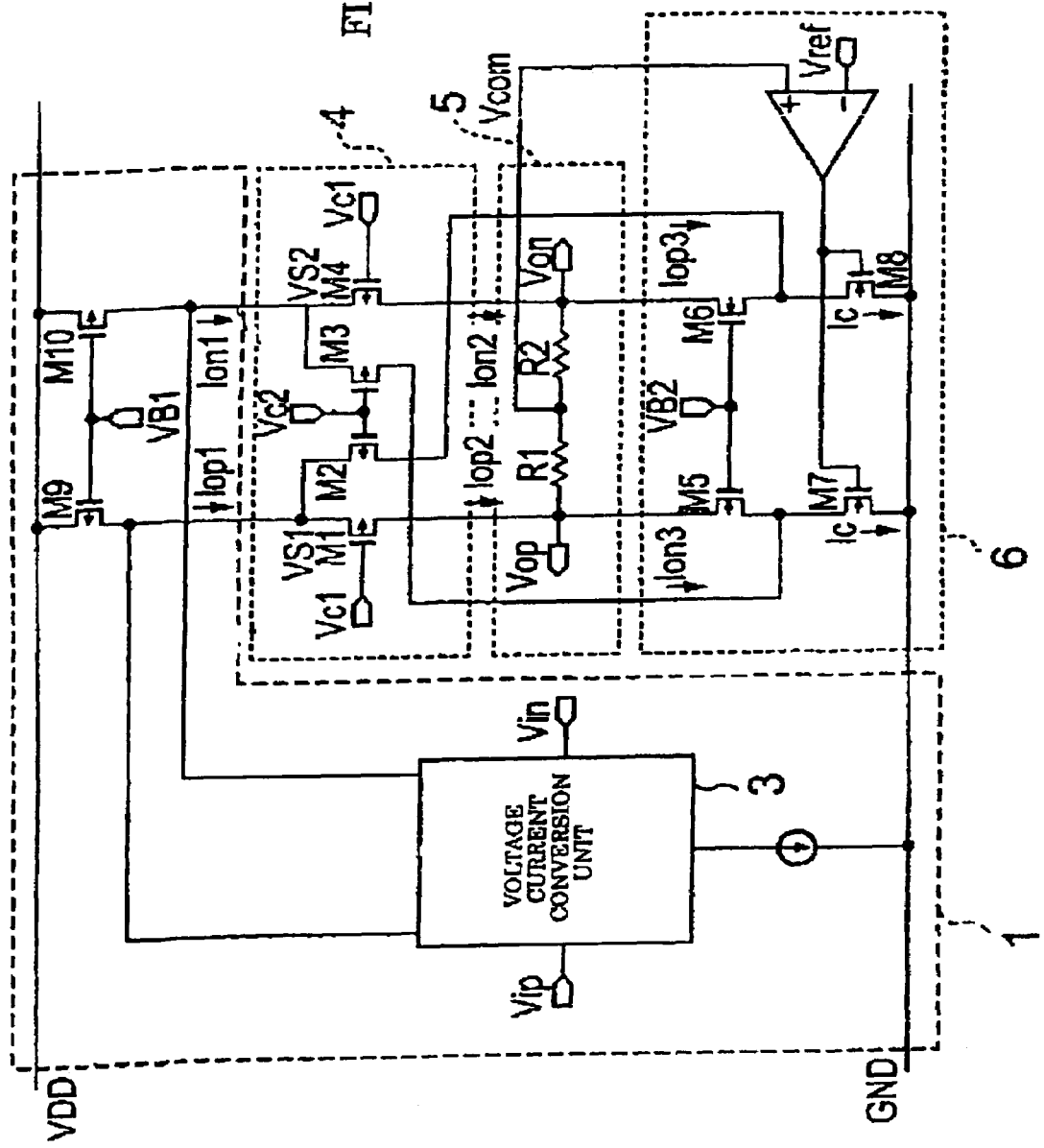
FIG. 4 is an exemplary circuit configuration for variable gain amplifier illustrated in FIG. 3.

FIG. 4 shows a circuit configuration of the variable gain amplifier shown in FIG. 3. As explained above, the currents Ion3 and Iop3 from the variable gain unit 4 are respectively connected to a drain terminal of a transistor M7 and a drain terminal of transistor M8 in the common-mode feedback unit 6 for addition. At this time, output voltages Vop and Von from the voltage output unit 5 is represented by the following formula (23).

$$Vop = Z(Iop2-(Ic-Ion3))+Vcom$$

$$Von = Z(Ion2-)Ic-Iop33))+Vcom \qquad (23)$$

Accordingly, it is represented as formula (24).

$$Vo = Vop - Von = Z(Iop2 - Ion2 + Iion3 - Iop3) \qquad (24)$$
$$= 2Z\sqrt{2K_2}\left(\sqrt{Iop1} - \sqrt{Ion1}\right)$$
$$= 2Zvc\sqrt{\frac{2K2}{I_B}}\, g_m Vin$$

Figure 15:
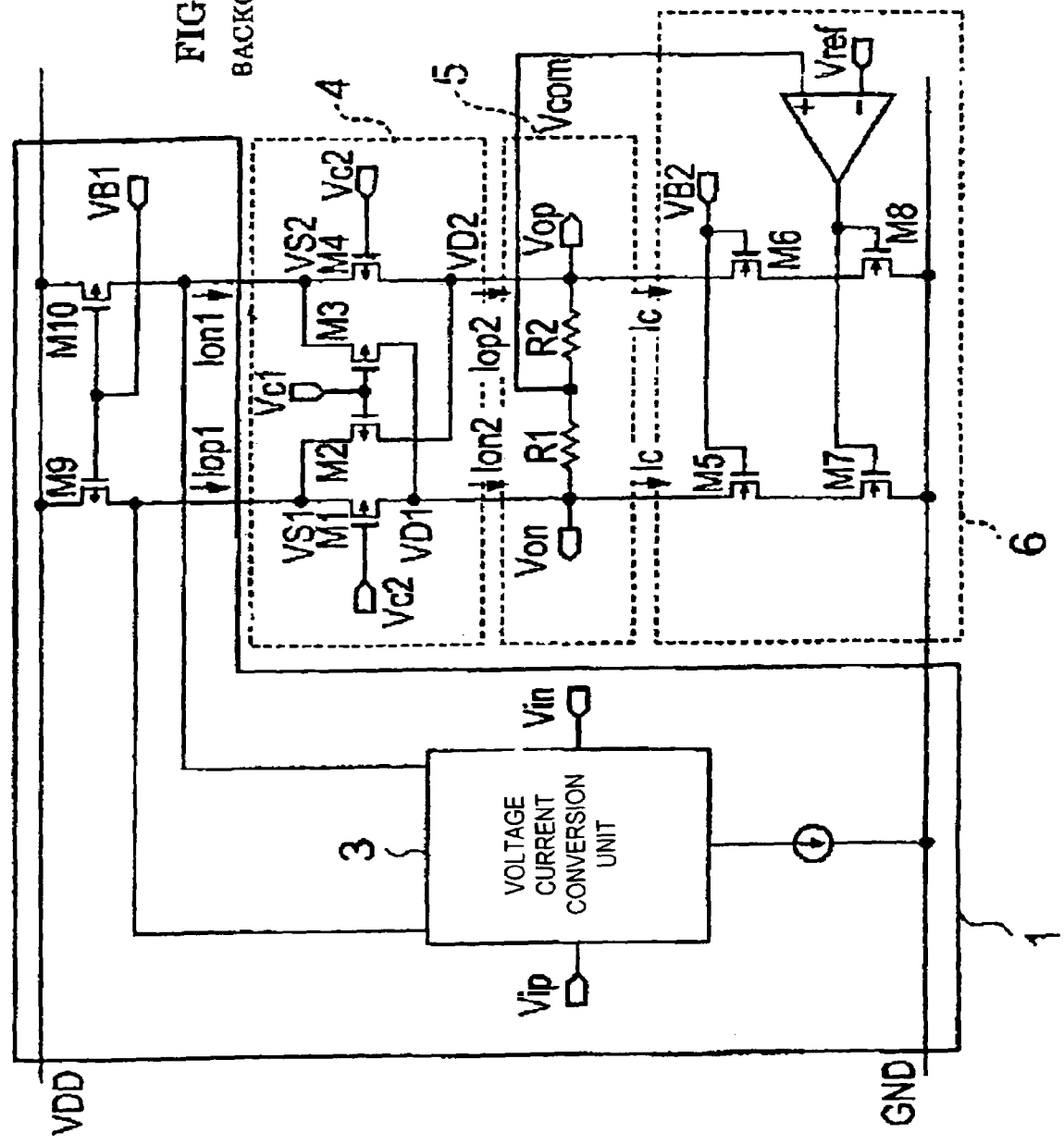
FIG. 15 is a circuit configuration of variable gain amplifier illustrated in FIG. 14.

Formula (24) is similar to formula (12) representing the output voltage of the conventional variable gain amplifier shown in FIG. 15.

In this embodiment illustrated in FIG. 4, currents Iop3 and Ion3 including signal elements are used for an addition. Accordingly, it becomes possible to obtain a wider range of the variable gain compared to the embodiment illustrated in FIG. 2 in which currents Iop3 and Ion3 are wasted by connecting to ground terminal. Further, in this embodiment, each drain terminal of transistors M2 and M3 in the variable gain unit 4 does not connect to the voltages Vop and Von from the voltage output unit 5. Accordingly, the voltage Vc2 does not influence the impedances of the output terminals Vop and Von. Even when control voltage Vc2 reaches to the ground potential, the drain terminal voltages of the transistors M7 and M8 in the common-mode feed back unit 6 never become lower than the voltage Vthp of transistors M2 and M3 in the variable gain unit 4. Consequently, the control voltage Vc2 can vary from the earth potential to the control voltage Vc1. However, even when the control voltage Vc2 becomes earth potential, it needs to avoid cutting off of the transistors M2 and M3.

As similar to the above-explained embodiment of the variable gain amplifier consistent with the present invention, if each of the transistor sizes, i.e., channel width W, of transistors M2 and M3 is made to be larger than the respective channel width W of transistors M1 and M4 in the variable gain unit 4, the gain of the variable gain amplifier does not become negative, even when the condition Vc2>Vc1 is met. Namely, in order to operate the transistors M9 and M10 in the voltage current conversion circuit 1 in a saturation area, the upper limit value of the control voltage Vc2 is represented by formula (25).

$$Vc_2 \leq VDD-)V_{DS(sat.)}+V_{TP}) \qquad (25)$$

By summarizing the above, the maximum value $Vo_{max}$ and minimum value $Vo_{min}$ of the control voltage Vc2 and the output voltage Vo are represented by formulas (26).

$$V_{C2\,max} = VDD-(V_{DS(sat.)}+V_{Tp})$$
$$V_{C2\,min} = 0$$
$$Vo_{max} = V_{C1}+V_{Tp}$$
$$Vo_{min} = 2V_{DS(sat.)} \qquad (26)$$

Accordingly, the sum of the maximum amplitude of the output voltage Vo and the variable voltage range of the control voltage is obtained by equation (27).

$$\max\{V_{O\_P-P}\}+\max\{V_{C\_P-P}\} = Vo\,\max-Vo\,\min + (V_{C2\,max}-V_{C2\,min}) = VDD-3V_{DS(sat.)}+V_{C1} \qquad (27)$$

By comparing formula (27) to formula (17) for the conventional variable gain amplifier, it is understood that the sum of the maximum amplitude of the output voltage Vo and the variable voltage range of the control voltage in this embodiment consistent with the present invention is increased by the control voltage Vc1. Namely, the output voltage range or the control voltage range is wider by the value of the control voltage Vc1 element. Normally, the control voltage Vc1 is higher than at least VDD/2 in order to keep the output voltage range. Consequently, the control voltage range becomes higher than VDD/2 when compared to the conventional variable gain amplifier. This is a big advantage of the embodiment of the present invention.

By comparing formulas (12) and (24), it is understood that the input/output characteristics of the variable gain amplifier consistent with the embodiment of the present invention is the same as one of the conventional variable gain amplifier as illustrated in FIG. 15. Consequently, this means that the variable gain amplifier consistent with of an embodiment of the present invention expands its maximum output amplitude (dynamic range) or its control voltage range without changing the input/output characteristics of the variable gain amplifier. Namely, it becomes possible to realize a variable gain amplifier that is immune to disturbance noises.

Figure 5:
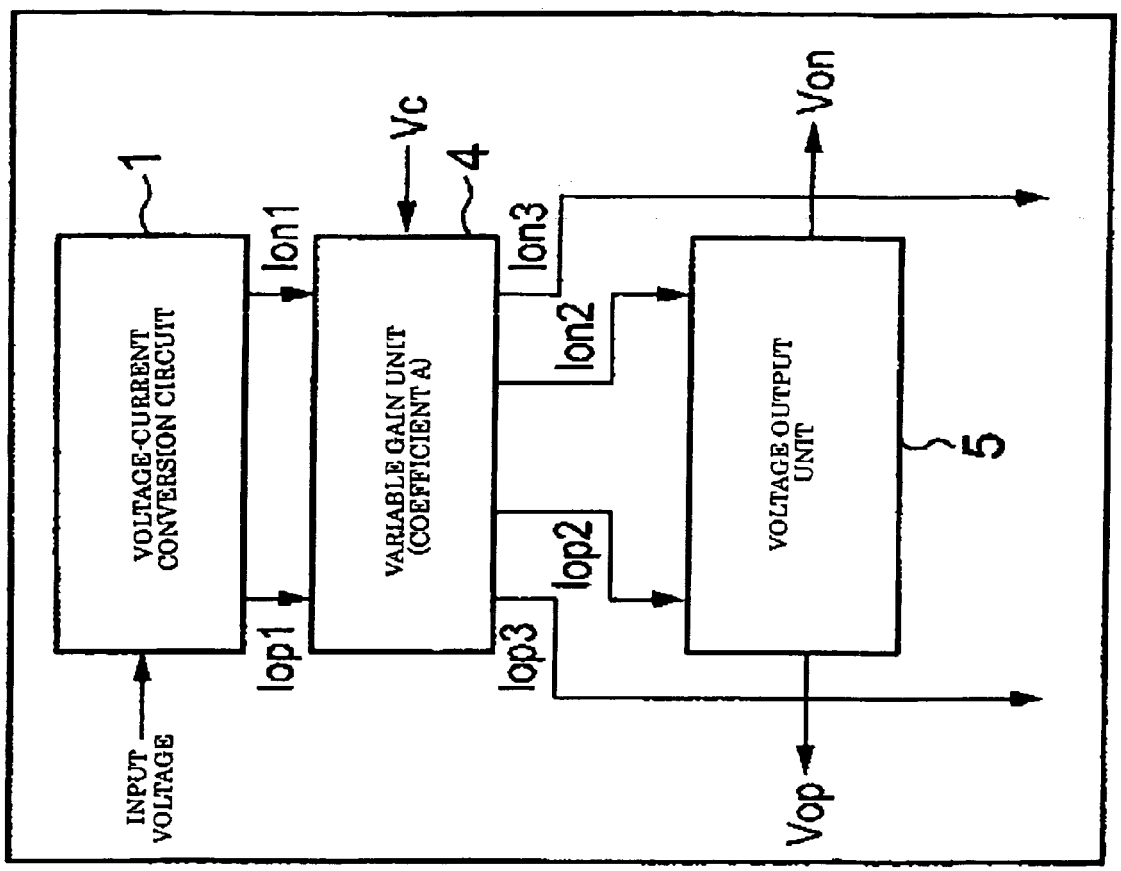
FIG. 5 is a functional block diagram of a further exemplary circuit diagram for a variable gain amplifier in which the methods and apparatus of an embodiment of the present invention may be implemented.
Figure 6:
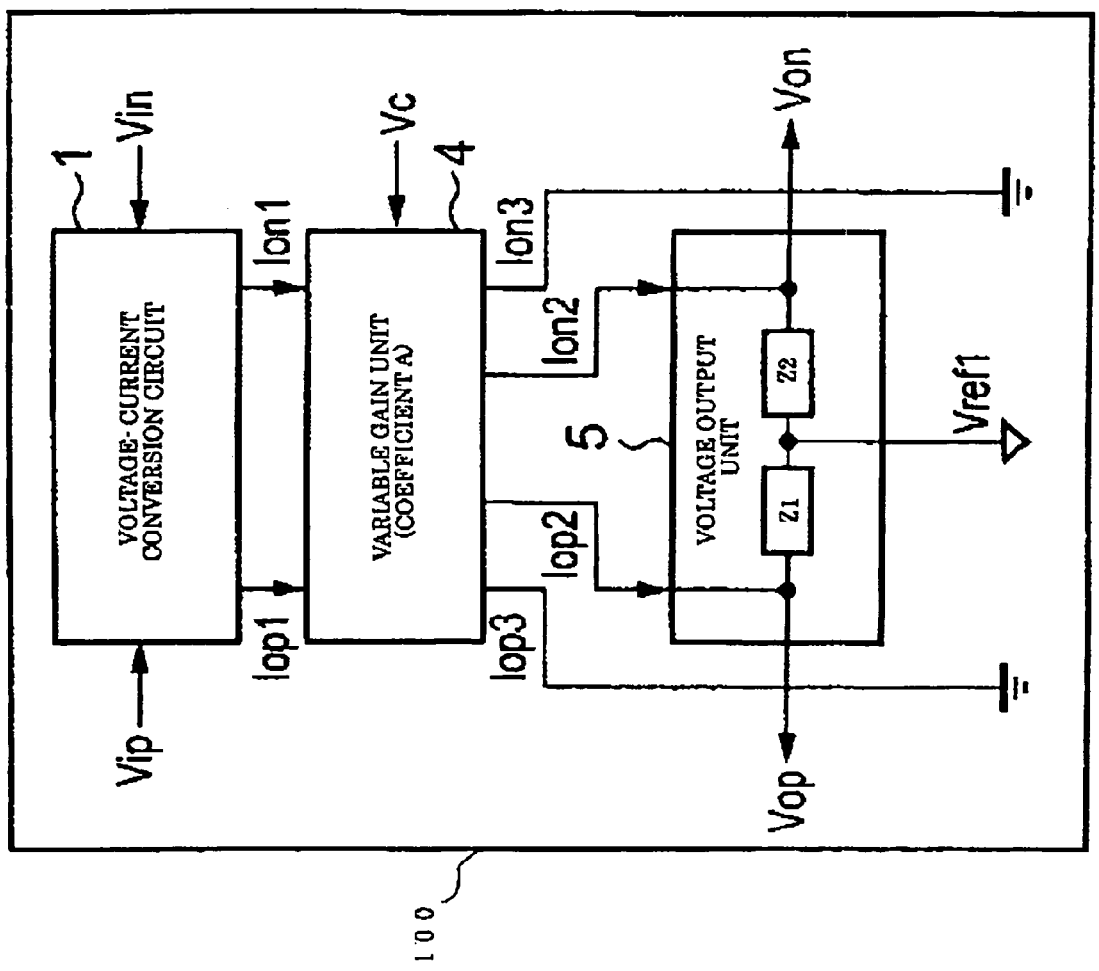
FIG. 6 is a functional block diagram of still another exemplary circuit diagram for a variable gain amplifier in which the methods and apparatus of an embodiment of the present invention may be implemented.

FIGS. 5–9 explain modifications of the embodiment of the variable gain amplifier consistent with the present invention. The embodiment illustrated in FIG. 5 is as similar to the embodiment illustrated in FIG. 1 in that both of the third positive current Iop3 and third negative current Ion3 are not supplied the voltage output unit 5 but instead are supplied to the ground potential side. It is also possible to connect both of third positive current Iop3 and third negative current Ion3 to a ground potential or a reference potential Vref The construction of the voltage-current conversion circuit 1 in the embodiment illustrated in FIG. 6 is basically similar to the one in the embodiment depicted in FIG. 3. In the embodiment in FIG. 6, both of the third positive current Iop3 and the third negative current Ion3 are connected to the ground potential. A connecting point of resistor elements z comprising the voltage output unit 5 is connected to a reference potential Vref1. According to this construction of the variable gain amplifier, it becomes possible to widely secure the dynamic range or the control voltage range for a variable gain control.

Figure 7:
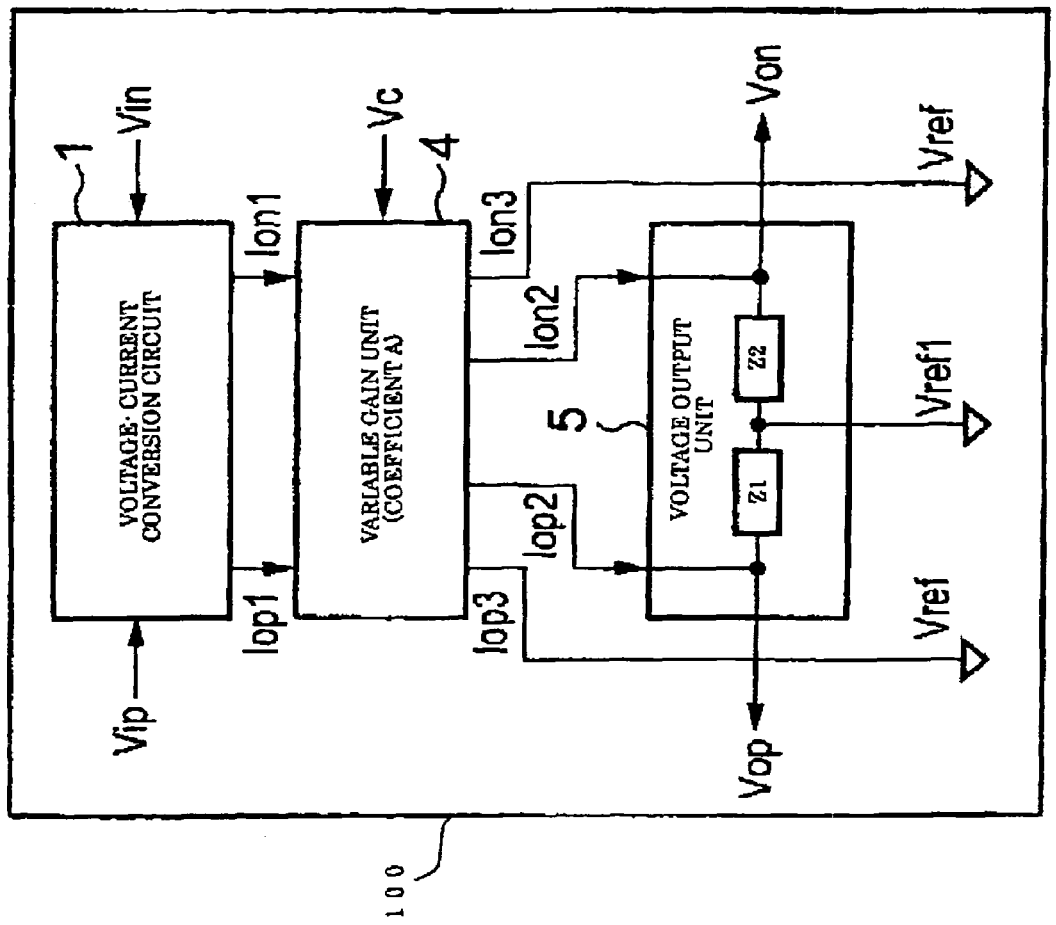
FIG. 7 is a functional block diagram of still further exemplary circuit diagram for a variable gain amplifier in which the methods and apparatus of an embodiment of the present invention may be implemented.

In the embodiment of the variable gain amplifier illustrated in FIG. 7, the third positive current Iop3 and third negative current Ion3 are not connected to the ground potential but instead to the reference potential Vref as similar to the connecting point of resistor elements of voltage output unit 5 in FIG. 6. According to this configuration, it is also possible maintain the dynamic range or the control voltage range width.

Figure 8:
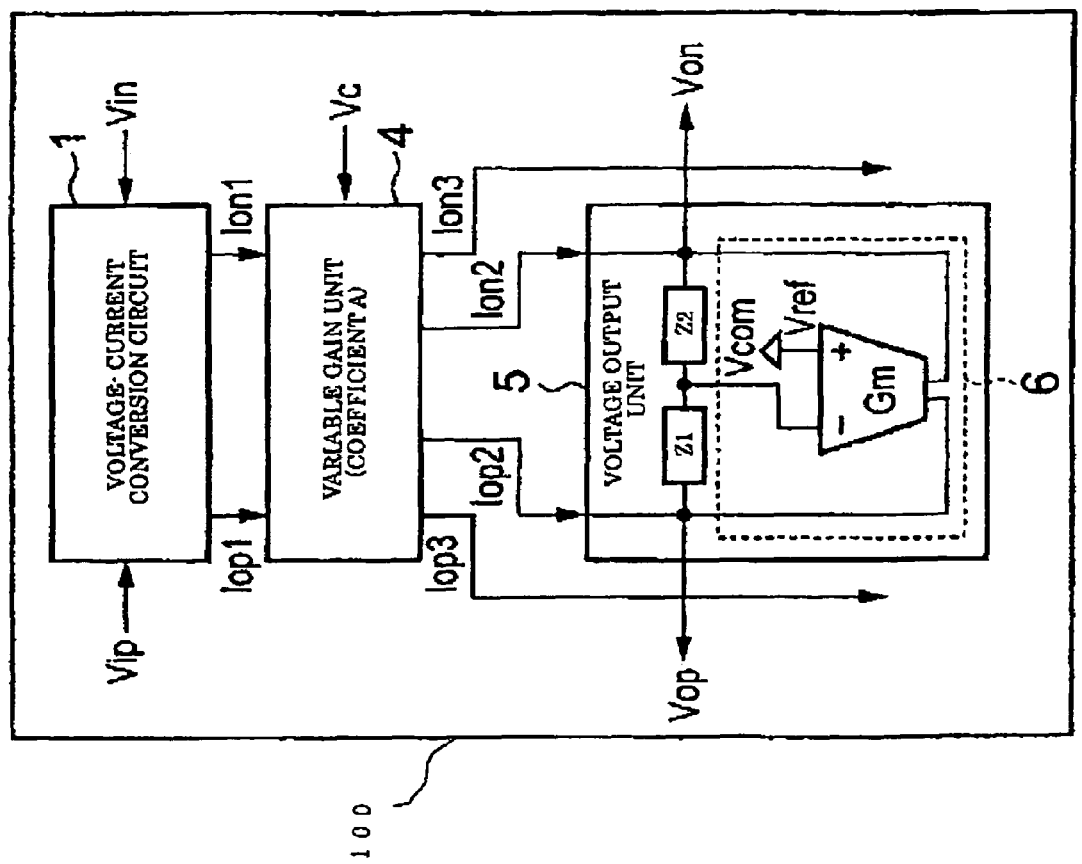
FIG. 8 is a functional block diagram of another exemplary circuit diagram for a variable gain amplifier in which the methods and apparatus of an embodiment of the present invention may be implemented.

In the embodiment of the variable gain amplifier illustrated in FIG. 8, the voltage output unit 5 is comprised of two load elements z and a common-mode feedback unit 6. Each of one end of the two load elements z is connected to the respective output terminal of the two output currents Iop2 and Ion2 among the four output currents Iop2, Iop3, Ion2 and Ion3 from the variable gain unit 4 and each of the other end, i.e., the connecting point, of the two load elements z is connected to a negative input terminal of the second voltage-current converter Gm. A positive input terminal of the second voltage-current conversion unit is connected to a reference voltage Vref. The third positive current Iop3 and the third negative current Ion3 may be connected to the ground potential or the reference potential Vref This configuration also can maintain a wider dynamic range or a wider control voltage range.

Figure 9:
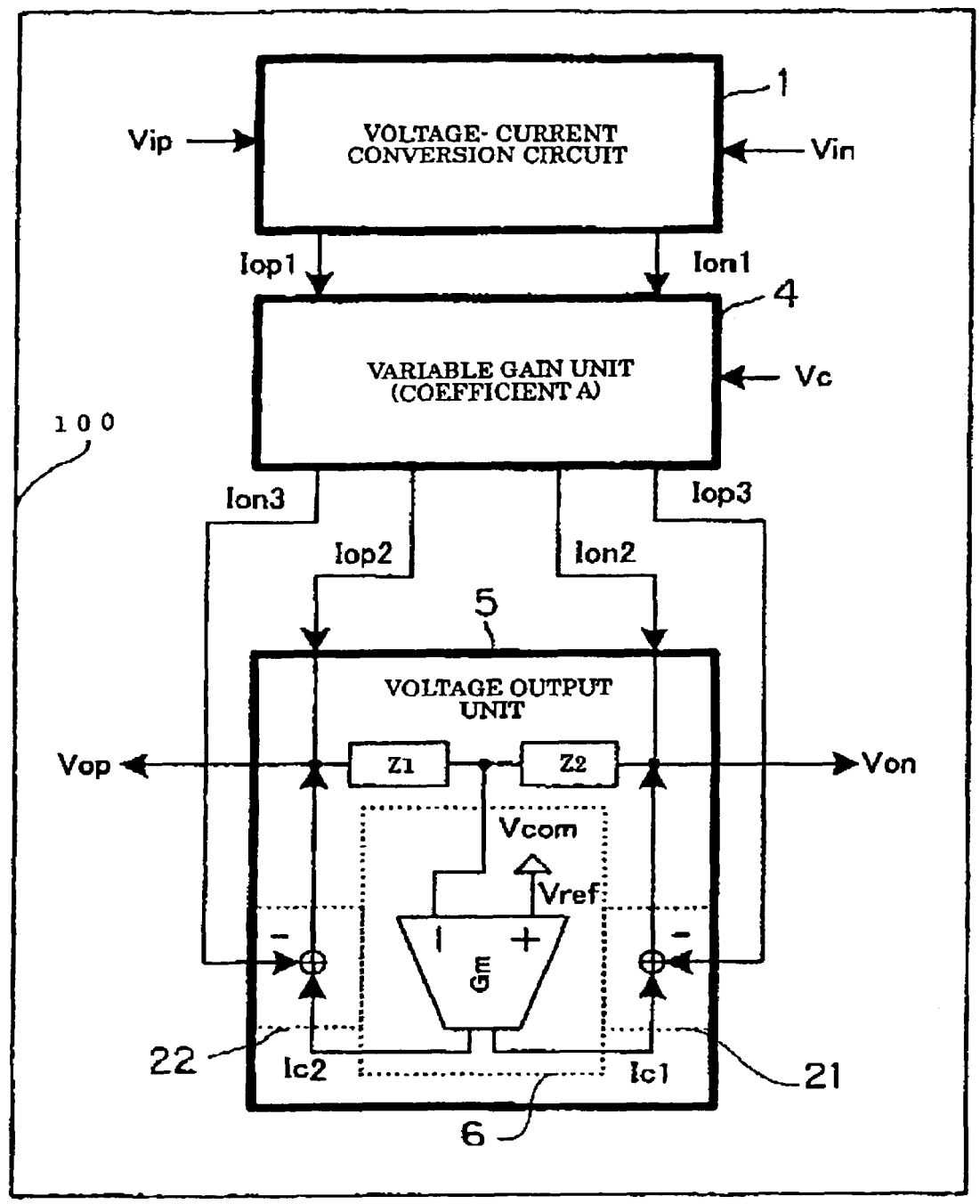
FIG. 9 is a functional block diagram of another exemplary circuit diagram for a variable gain amplifier in which the methods and apparatus of an embodiment of the present invention may be implemented.

The embodiment of variable gain amplifier illustrated in FIG. 9 is also characterized in that the configuration of the voltage output unit 5 is similar to the embodiment shown in FIG. 8. In FIG. 9, the voltage output unit 5 is comprised of two resister elements Z1 and Z2, a common-phase feedback unit 6, a first current adding unit 21 and a second current adding unit 22. Among the four output currents Ion3, Iop3, Iop2 and Ion2 from the variable gain unit 4, two output currents Iop2 and Ion2 are directly provided to the respective resister elements Z1 and Z2 in the voltage output unit 5. A third positive current Iop3 from the variable gain unit 4 is input to the first current adding unit 21 in order to subtract the output current Ic1 from the common-mode feedback unit 6. The subtracted output current from the first current adding unit 21 is provided to an output terminal of the negative output voltage Von of the voltage output unit 5. Similarly, a third negative current Ion3 from the variable gain unit 4 is input to the second current adding unit 22 in order to subtract the output current Ic2 from the common-mode feedback unit 6. The subtracted output current from the second current adding unit 22 is provided to an output terminal of the positive output voltage Vop of the voltage output unit 5.

Figure 10:
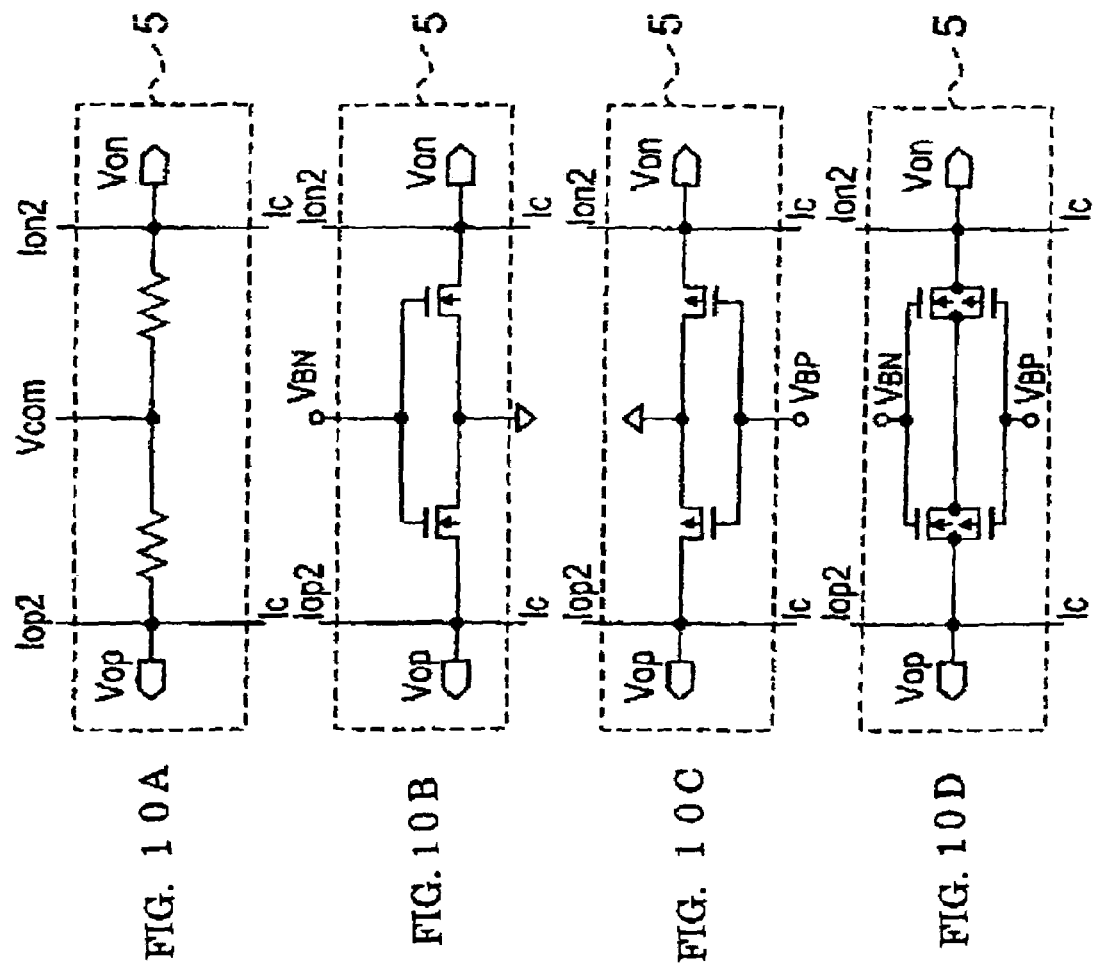
FIGS. 10A–10D illustrate exemplary circuit configurations of a voltage output unit in variable gain amplifier of an embodiment of the present invention.

As illustrated in FIGS. 2, 4 and 10A, the load elements in the voltage output unit 5 comprising the embodiment of the variable gain amplifier consistent with the invention are constructed by fixed resistor elements R1 and R2. FIGS. 10B–10D illustrate another configuration of the load elements in the voltage output unit 5. It is possible to change the resistor elements in the voltage output unit 5 in FIG. 10A to transistors. Thus, FIG. 10B shows an example of the load elements that are constructed by N channel transistors. FIG. 10C shows an example of the load elements that are constructed by P channel transistors. FIG. 10D shows an example of the load elements that are constructed by junction type transistors of N channel transistor and P channel transistor.

When the load elements are constructed by the fixed resister elements, it is advantageous for stabilizing operations with a small area size of the elements. When the load elements are constructed by transistors, the setting area size becomes larger than the area for the fixed resistor elements. However, it is advantageous for achieving precise control of the gain by controlling a gate voltage. If the technical field applying the variable gain amplifier consistent with the invention needs a precise control, transistors are advantageous for constructing the load elements.

Figure 11:
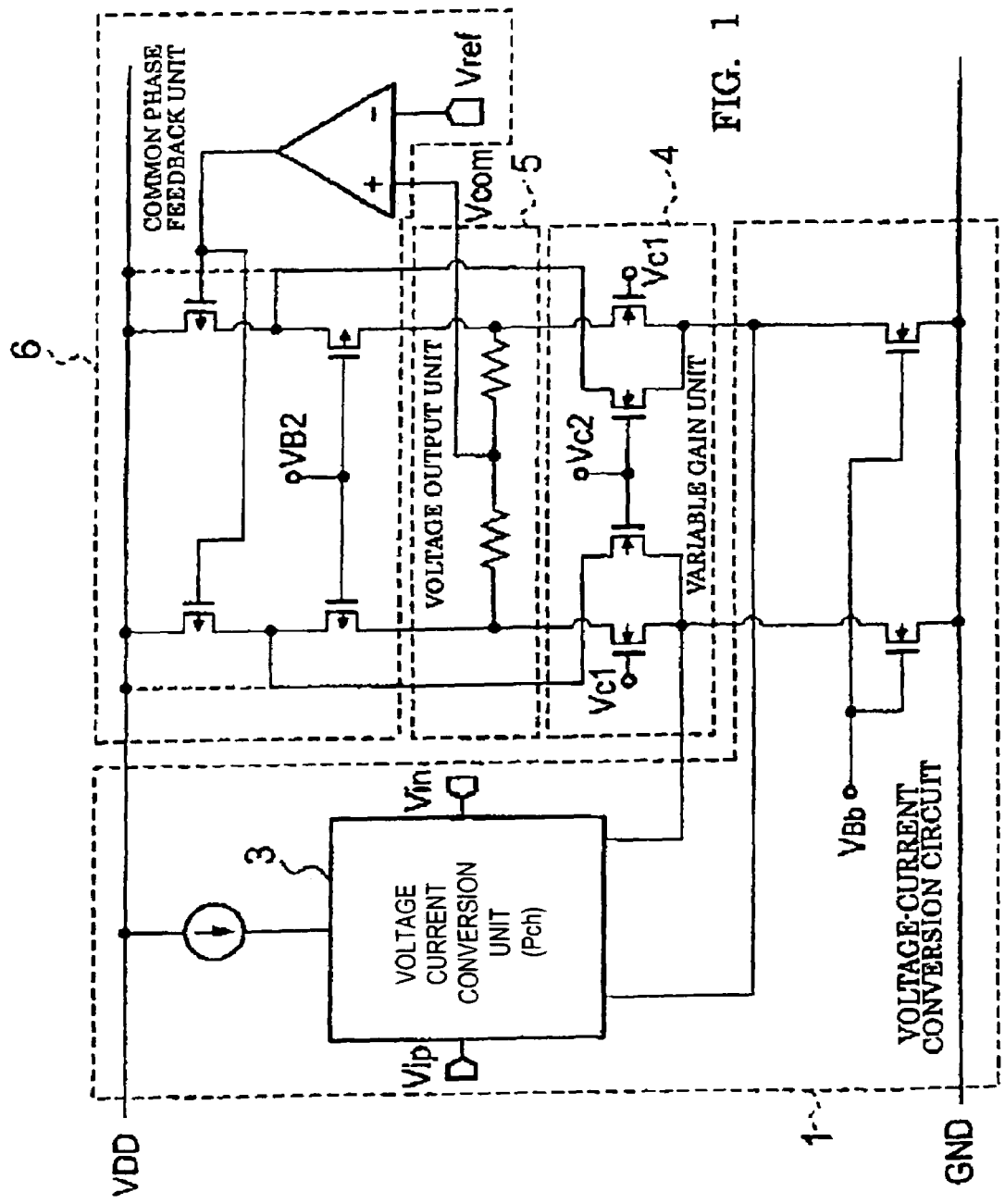
FIG. 11 is a functional block diagram of another exemplary circuit diagram for a variable gain amplifier in which the methods and apparatus of an embodiment of the present invention may be implemented.

In FIGS. 2 and 4, the variable gain amplifier is constructed so that a source voltage $V_{DD}$ is used as an operational reference voltage mainly for N channel MOS transistors. As illustrated in FIG. 11, it may also possible to use a circuit configuration in which the polarity of the respective PMOS transistor and NMOS transistor is converted. Such that the variable gain amplifier as shown in FIG. 11 may operate using the ground voltage GND as an operational reference. Thus, it achieves the same advantages as explained in the embodiments illustrated in FIGS. 1 and 3.

The present invention is not limited to the above-explained variable gain amplifier. The present invention is also applicable to a large-scale integrated circuit (LSI) in which an analog signal processing unit installs the variable gain amplifier. For example, as an application of the variable gain amplifier at a high-frequency, such an LSI is used for an amplifying process for receiving signals from an optical disk or for a transmitting/receiving unit of intermediate frequency (IF) in a mobile communication.

Figure 12:
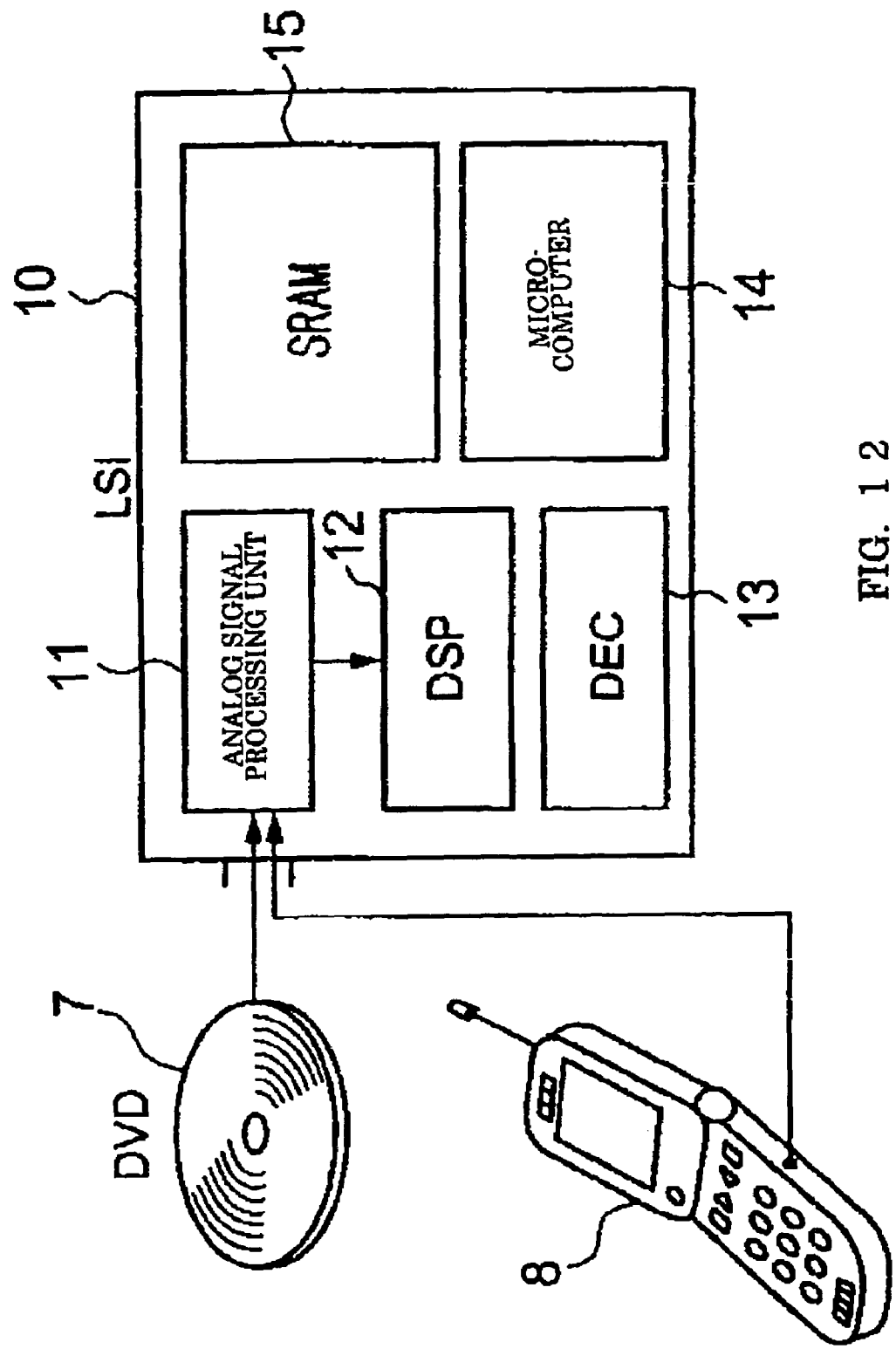
FIG. 12 is a functional block diagram for light received from an analog signal processing unit for signal processing and mobile communication transmitting/receiving signal processing LSI (large scale integrated circuit) used in the variable gain amplifier illustrated in FIG. 11.

As illustrated in FIG. 12, a light receiving signal processing LSI 10 is used for processing light signals reproduced from a disk media 7, such as a digital versatile disk (DVD) or a compact disk (CD). The light receiving signal processing LSI 10 is comprised of an analog signal processing unit 11 which installs a variable gain amplifier as explained in FIGS. 1, 3, 5–9, and 11, a digital signal processing (DSP) unit 12 for processing digital signals that are converted from analog signals in the analog signal processing unit 11, a decoder (DEC) 13 for decoding the coded signals in the DSP 12, a micro-computer 14 for performing calculations of the signal processing in the DEC 13 and a static random access memory (SRAM) 15 for storing data. The signal processing LSI 10 is constructed by mounting these elements on a circuit substrate.

The signal processing LSI 10 in FIG. 12 may also be used for processing image signals from a mobile communication terminal. In this case, the signal processing LSI 10 is used for processing transmitting/receiving signals. Thus the analog signal processing unit 11 installing the variable gain amplifier consistent with the present invention receives an input voltage of the receiving signals from the mobile communication terminal 8. The DSP 12 processes digital signals that are converted from the analog signals by the analog signal processing unit 11. Thus, the image signals involved in the mobile communication terminal 8 are processed as digital signals in the signal processing LSI 10.

Figure 13:
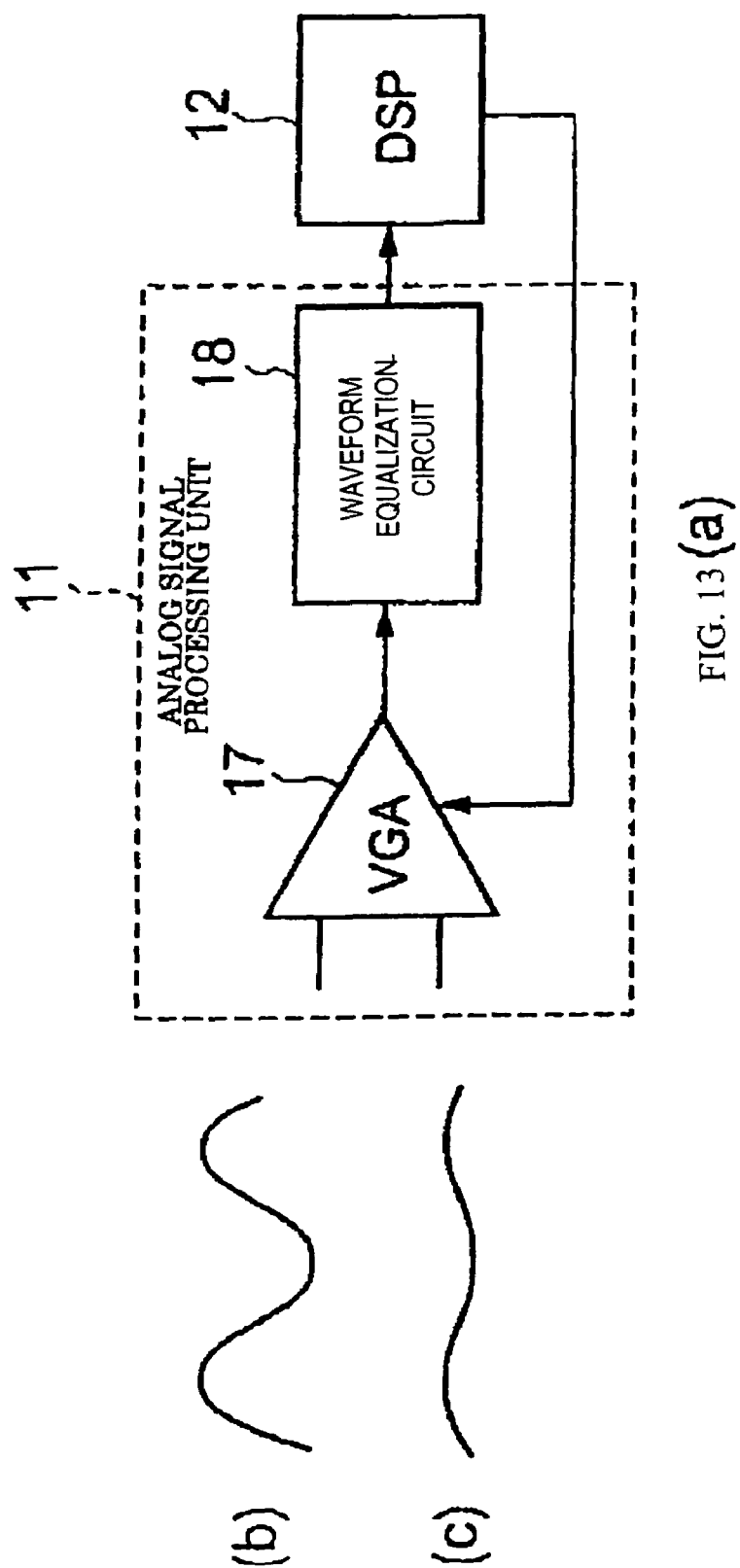
FIG. 13(a) is a circuit diagram of the analog signal processing unit 12 illustrated in FIG. 12.
FIG. 13(b) and FIG. 13(c) are waveforms thereof.
Figure 14:
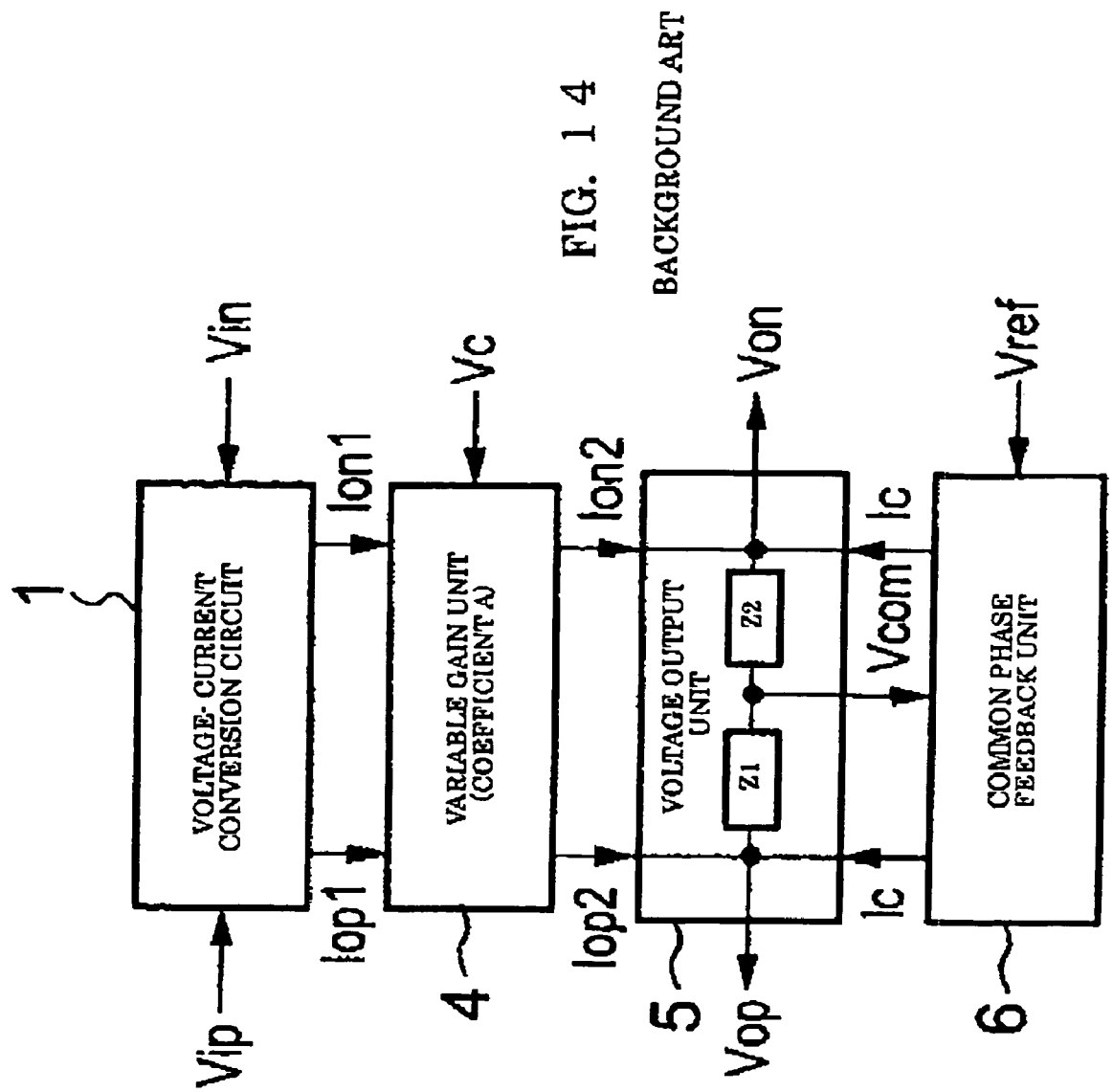
FIG. 14 is a functional block diagram illustrating a conventional variable gain amplifier.

FIG. 13(a) explains the construction of the analog signal processing unit 11 illustrated in FIG. 12. Thus, the analog signal processing unit 11 is comprised of a variable gain amplifier (VGA) 17 of an embodiment explained in FIGS. 1, 3, 5–9, and 11, and a waveform equalization circuit 18. The VGA 17 receives feedback data from the DSP 12. The feedback data relates to signal status. It is desirable that a waveform of the input voltage to the VGA 17 may be a sine wave as shown in FIG. 13(b). However, when received signals are obtained from a precise recording area such as an optical disk or when mobile communication signals are transmitted or received in an environment where radio quality is not secured, the waveform is disturbed as shown in FIG. 13(c). In such a case, it needs to perform a waveform shaping to such a disturbed signal voltage to obtain an appropriate sine wave as shown in FIG. 13(b). By providing the appropriate sine wave to the DSP 12, it is possible to obtain desired reproduced signals from optical received signals or a desired transmitting/receiving signals, in particular, desired receiving signals in a mobile communication terminal.

Figure 16:
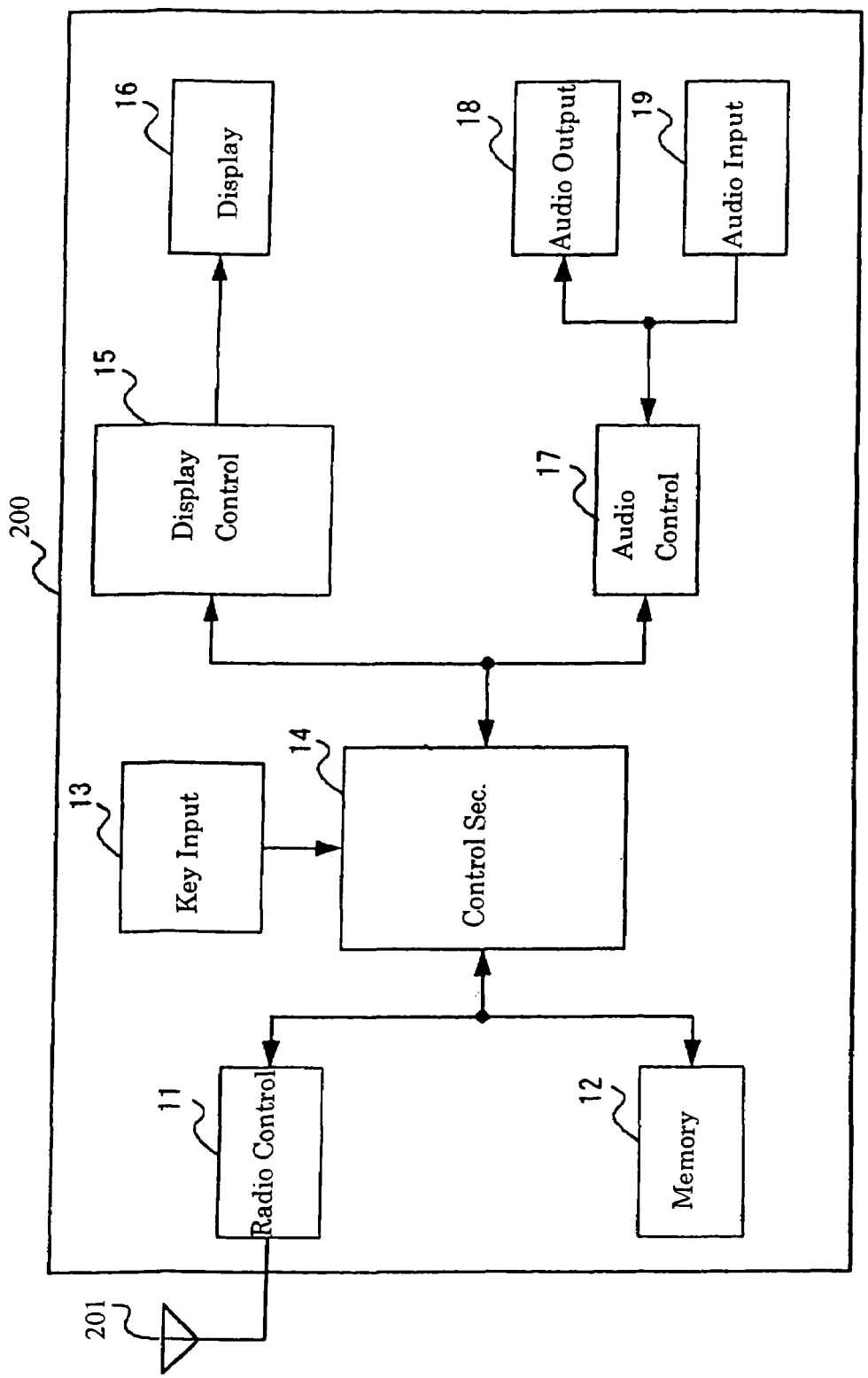
FIG. 16 is a block diagram illustrating a functional construction of a mobile communication terminal to which the variable gain amplifier consistent with the present invention is applied.

FIG. 16 is a block diagram illustrating a functional construction of a mobile communication terminal 200 to which the variable gain amplifier consistent with the present invention is applied. Radio frequency digital signals transmitted from a base station are received by the mobile communication terminal 200 through an antenna 201. The received digital signals are converted into intermediate frequencies in a radio controller 11. The converted signals are converted using a bandwidth extension process in an audio control unit 17 in accordance with a received data rate notified from a controller 14. Then, the processed signals are decoded under a PCM decoding process into analog receiving signals. The decoded analog signals are amplified in a receiving amplifier in an audio output unit 18and output as an audio through an speaker in the audio out unit 18. On the contrary, input audio into an audio input unit 19 through a microphone in the audio input unit 19 is amplified at an appropriate level by a transmitting amplifier in the audio input unit 19. The amplified input signals are converted to format signals by performing a bandwidth compression in accordance with a data rate based on an energy amount of the input audio. The format signals modulate carrier signals by using the transmitting data and a spectral diffusion process is performed by using a diffusion signal allotted to the respective transmitting channels. The diffused coded transmitting signals are converted into radio frequency signals by combining the signals with a local transmitting signal. Effective components of the frequency converted signals are amplified into high frequency signals and transmitted to the base station through the antenna of the mobile communication terminal. In the mobile communication terminal, the variable gain amplifier consistent with the present invention is applied to the amplifier in the radio control 11.

Figure 17:
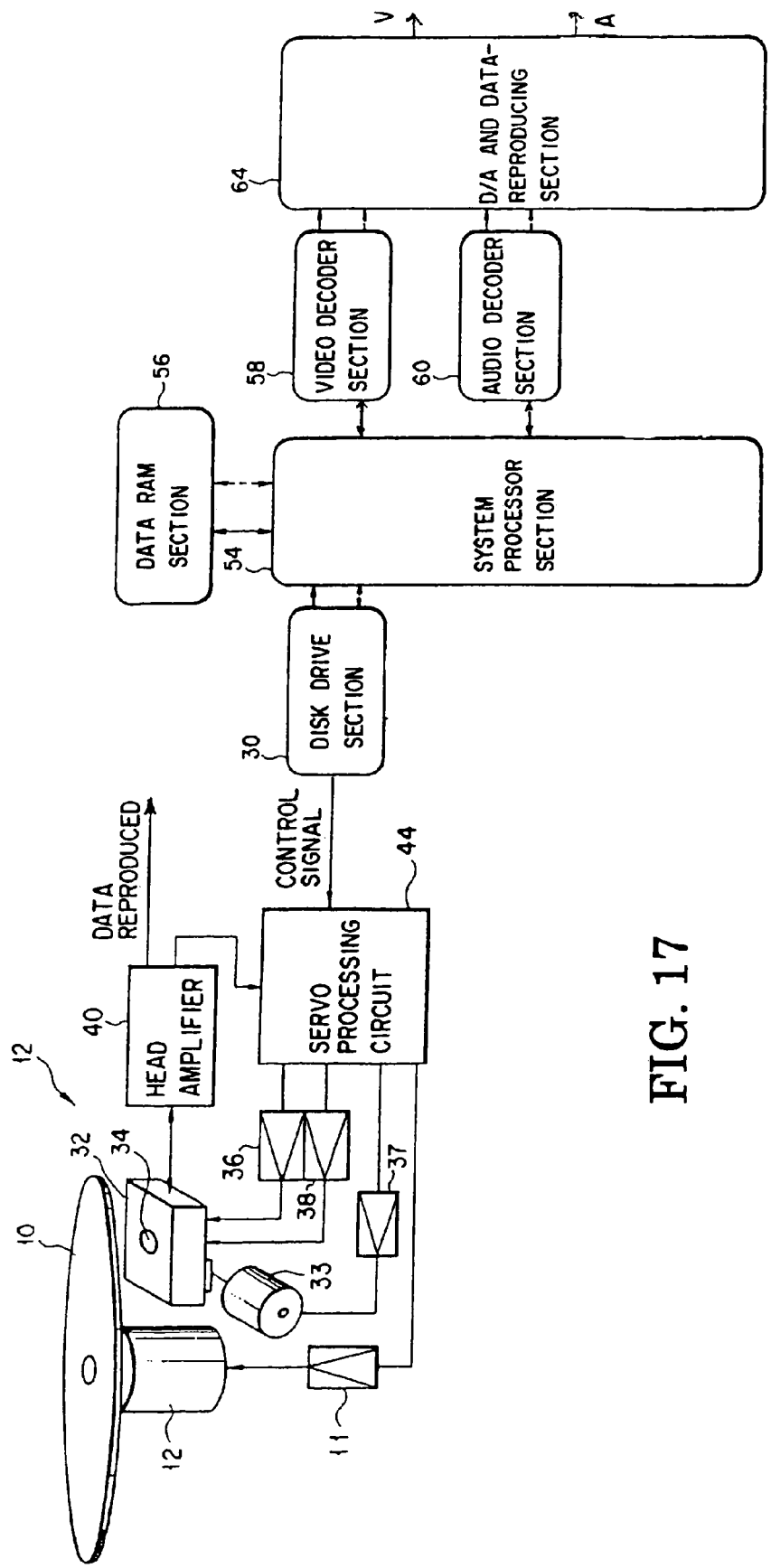
FIG. 17 is a block diagram illustrating details of a mechanism of a disk drive section of an optical disk apparatus in which the variable gain amplifier consistent with the present invention is applied.

FIG. 17 is a block diagram illustrating details of a mechanism of a disk drive section of an optical disk apparatus in which the variable gain amplifier consistent with the present invention is applied. Generally, an optical disk apparatus includes a disk drive section, a system processor section, a data RAM section, a video decoder section, an audio decoder section, and a D/A and data reproducing section. As shown in FIG. 17, the disk drive section contains a motor driving circuit 11, a spindle motor 12, an optical receiver i.e., an optical head 32, a feed motor 33, a focus circuit 36, a feed motor driving circuit 37, a tracking circuit 38, an optical head amplifier 40 and a servo processing circuit 44. To reproduce the data from the optical disk 10, the optical head 32 projects a laser beam on the optical disk 10. An objective lens 34 is moved across the radius of the optical disk 10 in accordance with the driving signal supplied from the tracking circuit 38. The laser beam is reflected from the recording layer on the optical disk 10 and returned to the optical head 32. The optical head 32 converts the beam reflected from the optical disk into an electric signal. The reproduced data is transferred and stored in the data RAM section by the system processor section. The stored reproduced data is processed in the system processor section and supplied to the video decoder section and the audio decoder section, respectively, and are decoded at the respective decoders. The D/A and data reproducing section converts the decoded video data and the audio data into an analog video signal and an analog audio signal, and supplies to the video signal and the analog audio signal to a monitor and a speaker, respectively in order to display the reproduced image and to reproduce the sound, respectively. In the optical disk apparatus, the variable gain amplifier consistent with the present invention is applied to the optical head amplifier 40.

As explained above, the variable gain amplifier consistent with the present invention expands the output voltage range, i.e., dynamic range, and the gain control voltage range without increasing the power consumption. Thus, it may easily provide a variable gain amplifier having a superior gain control characteristics by installing an analog signal processing unit mounted with the variable gain amplifier into an LSI.

Other embodiments of the invention will be apparent to those skilled in the art from consideration of the specification and practice of the invention disclosed herein. It is intended that the specification and examples be considered as exemplary only, with a true scope of and spirit of the invention being indicated by the following claims.

What is claimed is:

1. A variable gain amplifier, comprising:
    a voltage-current conversion circuit configured to output a first positive current and a first negative current in proportion to a positive input voltage and a negative input voltage, respectively;
    a variable gain unit configured to supply four output currents obtained by processing the first positive current and first negative current controlled by a gain factor A ($0<A<1$) controlled by a control signal, wherein the four output currents include a second positive current obtained by multiplying the first positive current by a factor A, a third positive current obtained by multiplying the first positive current by a factor (1-A), a second negative current obtained by multiplying the first negative current by the factor A, and a third negative current obtained by multiplying the first negative current by the factor (1-A);
    a voltage output unit configured to output a positive output voltage and a negative output voltage by selectively inputting either the second positive current and the second negative current or the third positive current and the third negative current; and
    a common-mode feedback unit configured to provide a feed-back loop through the voltage output unit using a voltage difference between the positive and negative output voltages and an external reference voltage.

2. The variable gain amplifier according to claim 1, wherein the voltage-current conversion circuit includes:
    a positive-negative input voltage generating unit configured to generate a positive input voltage and a negative input voltage by inputting an input voltage and a voltage-current conversion unit configured to output a first positive current; and
    a first negative current that are respectively in proportion to potential differences between the positive and negative input voltages supplied from the positive-negative input voltage generating unit.

3. The variable gain amplifier according to claim 1, wherein two output current terminals among the four output currents are coupled to a ground potential and not supplied to the voltage output unit.

4. The variable gain amplifier according to claim 1, wherein two output current terminals among the four output currents are couple to a different reference voltage source and not supplied to the voltage output unit.

5. The variable gain amplifier according to claim 1, wherein the voltage output unit comprises two load elements, one terminal of the respective load elements is connected to the respective output terminals of the two output currents among the four output currents supplied from the variable gain unit, and the other terminal of the respective load elements is connected to each other and the same reference potential as the other two output currents among the four output current supplied from the variable gain unit in order to output the positive output voltage and the negative output voltage from respective terminals of the voltage output unit.

6. The variable gain amplifier according to claim 1, wherein the voltage output unit includes load elements comprised of transistors.

7. The variable gain amplifier according to claim 1, wherein the voltage output unit comprises two load elements, one terminal of the respective two load elements is connected to the respective output terminals of the two output currents among the four output currents supplied from the variable gain unit and the other terminal of the respective two load elements is connected to the negative input terminal of a second voltage-current converter, and the common-mode feedback unit is configured to supply an output current from the second voltage-current conversion unit to a positive output terminal and a negative output terminal, wherein a positive input terminal of the second voltage-current conversion unit is connected to the reference voltage.

8. The variable gain amplifier according to claim 7, wherein the load elements of the voltage output unit are constructed by transistors.

9. The variable gain amplifier according to claim 7, wherein the voltage output unit is configured so one of the second or the third positive currents among the four output currents from the variable gain unit, which is not inputted to the voltage output unit, is supplied to a first current adding unit for performing a subtraction from an output current of the common-mode feedback unit in order to supply a first subtracted value to the negative output voltage terminal of the voltage output unit, and one of the second or the third negative currents, which is not inputted to the voltage output unit, is supplied to the second current adding unit for performing a subtraction from an output current of the common-mode feedback unit in order to supply a second subtracted value to a positive output voltage terminal of the voltage output unit.

10. A light receiving signal processing LSI, comprising:
an analog signal processing unit installed with the variable gain amplifier in which the input voltage may include at least one optical signal voltage generated from an optical receiver;
a digital signal processing unit configured to process digital signals converted from analog signals supplied from the analog signal processing unit;
a decoder configured to decode the converted digital signals; and
a processing unit configured to perform signal processing calculations in the analog signal processing unit, the digital signal processing unit, and the decoder, respectively, wherein,
the variable gain amplifier, comprises:
a voltage-current conversion circuit configured to output a first positive current and a first negative current in proportion to a positive input voltage and a negative input voltage, respectively,
a variable gain unit configured to supply four output currents obtained by processing the first positive current and first negative current controlled by a gain factor A (0<A<1) controlled by a control signal, wherein the four output currents include a second positive current obtained by multiplying the first positive current by a factor A, a third positive current obtained by multiplying the first positive current by a factor (1-A), a second negative current obtained by multiplying the first negative current by the factor A, and a third negative current obtained by multiplying the first negative current by the factor (1-A),
a voltage output unit configured to output a positive output voltage and a negative output voltage by selectively inputting either the second positive current and the second negative current or the third positive current and the third negative current, and
a common-mode feedback unit configured to provide a feed-back loop through the voltage output unit using a voltage difference between the positive and negative output voltages and an external reference voltage.

11. A transmitting/receiving signals processing LSI applicable to a mobile communication terminal, comprising:
an analog signal processing unit installed with the variable gain amplifier in which the input voltage may include at least one signal received at a mobile communication terminal as the input voltage;
a digital signal processing unit configured to process digital signals converted from analog signals supplied from the analog signal processing unit;
a decoder configured to decode the converted digital signals; and
a processing unit configured to perform signal processing calculations in the analog signal processing unit, the digital signal processing unit, and the decoder, respectively, wherein,
the variable gain amplifier, comprises:
a voltage-current conversion circuit configured to output a first positive current and a first negative current in proportion to a positive input voltage and a negative input voltage, respectively,
a variable gain unit configured to supply four output currents obtained by processing the first positive current and first negative current controlled by a gain factor A (0<A<1) controlled by a control signal, wherein the four output currents include a second positive current obtained by multiplying the first positive current by a factor A, a third positive current obtained by multiplying the first positive current by a factor (1-A), a second negative current obtained by multiplying the first negative current by the factor A, and a third negative current obtained by multiplying the first negative current by the factor (1-A),
a voltage output unit configured to output a positive output voltage and a negative output voltage by selectively inputting either the second positive current and the second negative current or the third positive current and the third negative current, and
a common-mode feedback unit configured to provide a feed-back loop through the voltage output unit using a voltage difference between the positive and negative output voltages and an external reference voltage.

12. A mobile communication terminal comprising:
a radio controller configured to convert and amplify received radio frequency digital signals into intermediate frequencies, and to convert and amplify transmitting signals into high frequency signals;
a control unit configured to control operations of the mobile communication terminal;
an audio control unit configured to perform a bandwidth extension process and a bandwidth compression process in accordance with a data rate received from the control unit; and
an audio input/output unit configured to amplify output analog signals and input analog signals supplied to a speaker from a microphone in the audio input/output unit;
wherein the radio controller includes a variable gain amplifier, comprising:
a voltage-current conversion circuit configured to output a first positive current and a first negative current in proportion to a positive and a negative input voltage, respectively;
a variable gain unit configured to supply four output currents obtained by processing first positive current and first negative current controlled by a gain factor A (0<A<1) controlled by a control signal, wherein the four output currents include a second positive current obtained by multiplying the first positive current by the factor A, a third positive current obtained by multiplying the first positive current by the factor (1-A), a second negative current obtained by multiplying the first negative current by the factor A, and a third negative current obtained by multiplying the first negative current by the factor (1-A); and a voltage output unit configured to output a positive output voltage and a negative output voltage by inputting either the second positive current and the second negative current or the third positive current and the third negative current.

13. An optical disk apparatus, comprising:

an optical disk drive section including an optical receiver configured to project a laser beam on an optical disk and convert the laser beam reflected from the optical disk into an electric signal, and an optical head amplifier configured to amplify reproduced data through the optical receiver;

a system processor section configured to control operations of the optical disk apparatus;

a data RAM section configured to store the reproduced data, a video decoder section configured to decode the video data stored in the data RAM section;

an audio decoder section configured to decode the audio data stored in the data RAM section; a D/A and data reproducing section configured to convert the decoded video and audio data into an analog video and an audio signal, respectively; and a monitor and a speaker configured to display the reproduced video data and to reproduce the reproduced audio data, respectively;

wherein the optical head amplifier includes a variable gain amplifier, comprising:

a voltage-current conversion circuit configured to output a first positive current and a first negative current in proportion to a positive input voltage and a negative input voltage, respectively;

a variable gain unit configured to supply four output currents obtained by processing the first positive current and first negative current controlled by a gain factor A (0<A<1) controlled by a control signal, wherein the four output currents include a second positive current obtained by multiplying the first positive current by the factor A, a third positive current obtained by multiplying the first positive current by the factor (1-A), a second negative current obtained by multiplying the first negative current by the factor A, and a third negative current obtained by multiplying the first negative current by the factor (1-A); and a voltage output unit configured to output a positive output voltage and a negative output voltage by selectively inputting either the second positive current and the second negative current or the third positive current and the third negative current; and a common-node feedback unit configured to provide a fee-back loop through the voltage output unit using a voltage difference between the positive and negative output voltages and an external reference voltage.

14. The variable gain amplifier according to claim 1, wherein the common-mode feedback unit is configured to ensure that the mean value of the positive output voltage and the negative output voltage is equal to the external reference voltage Vref.

* * * * *